United States Patent
Kanda et al.

(10) Patent No.: US 10,964,739 B2
(45) Date of Patent: Mar. 30, 2021

(54) IMAGING APPARATUS AND CONTROL METHOD THEREOF

(71) Applicant: CANON KABUSHIKI KAISHA, Tokyo (JP)

(72) Inventors: Akihiko Kanda, Kawasaki (JP); Yoshihito Tamaki, Yokohama (JP); Hideyuki Hamano, Kawasaki (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 67 days.

(21) Appl. No.: 16/123,672

(22) Filed: Sep. 6, 2018

(65) Prior Publication Data

US 2019/0088702 A1 Mar. 21, 2019

(30) Foreign Application Priority Data

Sep. 20, 2017 (JP) .............................. JP2017-180174
Sep. 20, 2017 (JP) .............................. JP2017-180177
Jun. 29, 2018 (JP) .............................. JP2018-123774

(51) Int. Cl.
| | |
|---|---|
| *H04N 5/00* | (2011.01) |
| *H01L 27/146* | (2006.01) |
| *H04N 5/232* | (2006.01) |
| *H04N 5/235* | (2006.01) |
| *H04N 5/225* | (2006.01) |
| *H04N 5/243* | (2006.01) |

(Continued)

(52) U.S. Cl.
CPC ..... *H01L 27/14627* (2013.01); *H04N 5/2259* (2013.01); *H04N 5/2353* (2013.01); *H04N 5/232123* (2018.08); *H04N 5/243* (2013.01); *H04N 5/36961* (2018.08); *H04N 19/136* (2014.11)

(58) Field of Classification Search
CPC ............ H01L 27/14627; H04N 19/136; H04N 5/36961; H04N 5/232123; H04N 5/2259; H04N 5/2353; H04N 5/243
See application file for complete search history.

(56) References Cited

U.S. PATENT DOCUMENTS

| | | | |
|---|---|---|---|
| 4,410,804 A | 10/1983 | Stauffer | |
| 5,189,530 A * | 2/1993 | Fujii | ................... H04N 11/044 358/539 |

(Continued)

FOREIGN PATENT DOCUMENTS

| | | |
|---|---|---|
| EP | 1 085 751 A2 | 3/2001 |
| JP | 2001-083407 A | 3/2001 |
| JP | 2016-094020 A | 5/2016 |

*Primary Examiner* — Ping Y Hsieh

(74) *Attorney, Agent, or Firm* — Cowan, Liebowitz & Latman, P.C.

(57) ABSTRACT

An imaging apparatus includes an image acquisition unit that acquires a plurality of viewpoint images, an operation information acquisition unit that acquires imaging conditions when the viewpoint image is captured, and a compression unit that compresses the viewpoint image to be recorded on a flash memory (133), and the compression unit compresses the viewpoint image according to imaging conditions such as ISO sensitivity and an aperture value or a value of contrast information corresponding to a contrast distribution. The compression unit changes a compression rate for compressing the viewpoint image according to the imaging conditions or the value of the contrast information.

8 Claims, 18 Drawing Sheets

(51) Int. Cl.
*H04N 5/369* (2011.01)
*H04N 19/136* (2014.01)

(56) References Cited

U.S. PATENT DOCUMENTS

| | | | | |
|---|---|---|---|---|
| 9,413,977 | B1* | 8/2016 | Rudin | G03B 7/097 |
| 2005/0249291 | A1* | 11/2005 | Gordon | H04N 19/176 |
| | | | | 375/240.18 |
| 2016/0165156 | A1* | 6/2016 | Liege | H04N 5/2256 |
| | | | | 348/216.1 |
| 2016/0329078 | A1* | 11/2016 | Park | H04N 19/156 |
| 2017/0353678 | A1* | 12/2017 | Ogushi | H04N 5/2353 |

* cited by examiner

FOCAL POSITION

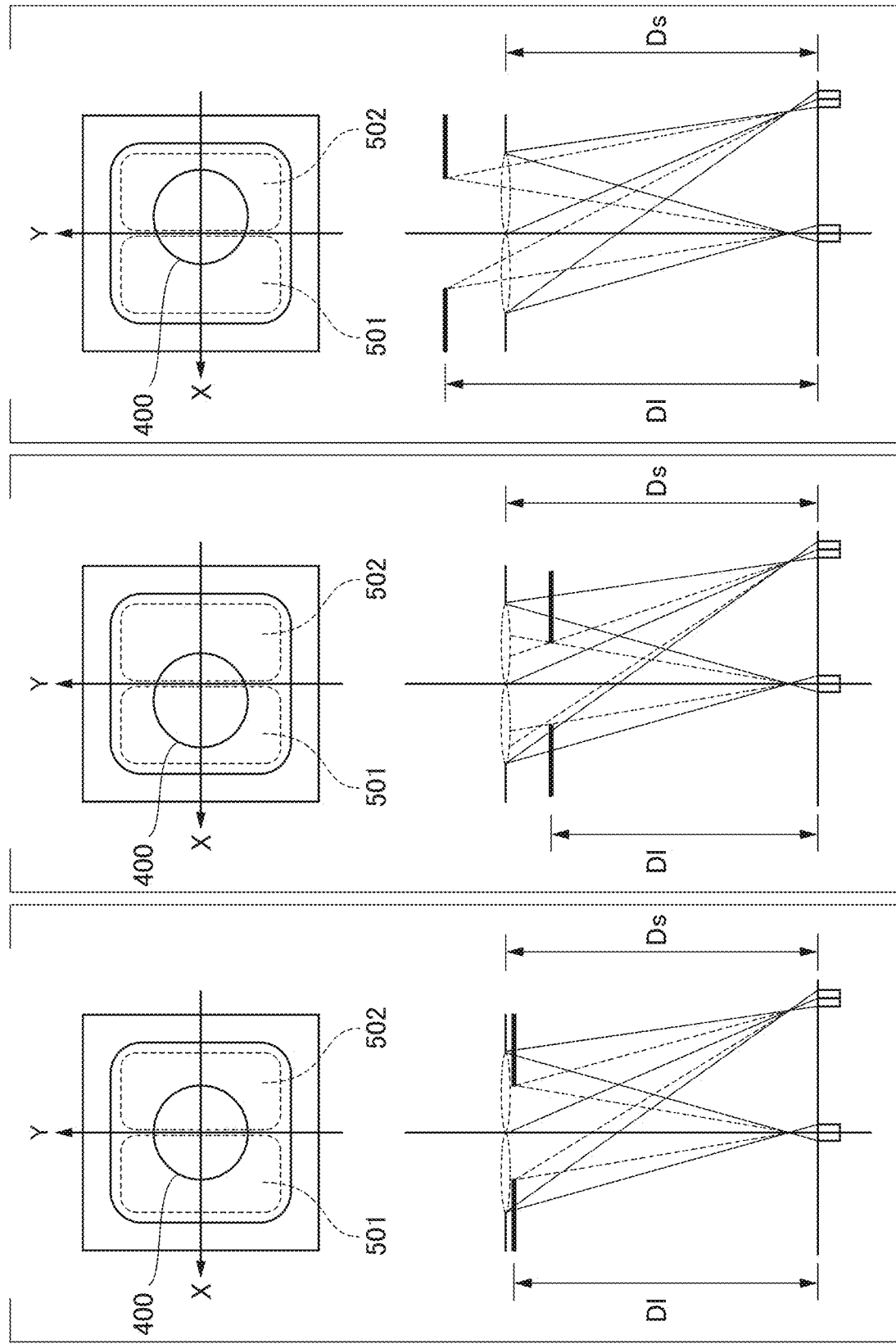

IMAGING APPARATUS AND CONTROL METHOD THEREOF

BACKGROUND OF THE INVENTION

Field of the Invention

The present invention relates to an imaging apparatus and a control method thereof.

Description of the Related Art

In an imaging surface phase difference scheme adopted in an imaging apparatus, focus detection using a phase difference scheme is performed by focus detection pixels formed in an imaging element. An imaging apparatus disclosed in the specification of U.S. Pat. No. 4,410,804 uses a two-dimensional imaging element in which one microlens and a plurality of divided photoelectric conversion portions are formed for one pixel. The plurality of divided photoelectric conversion portions are configured to receive different areas of an exit pupil of the imaging lens via the one microlens and perform pupil division. Each photoelectric conversion portion generates a viewpoint signal from the received light. By calculating an amount of image shift from a parallax between the plurality of viewpoint signals and converting the amount of image shift into the amount of defocus, focus detection using a phase difference scheme is performed. Japanese Unexamined Patent Publication No. 2001-083407 discloses that an imaging signal is generated by adding a plurality of viewpoint signals generated by a plurality of divided photoelectric conversion portions.

When a file including a plurality of viewpoint signals is generated, a data size of an image file becomes larger than usual, and a recording medium with a large capacity is required. Japanese Patent Application No. 2016-094020 discloses a control method in which a viewpoint signal is deleted when the viewpoint signal becomes unnecessary after execution of a predetermined process based on the viewpoint signal.

However, in Japanese Patent Application No. 2016-094020, since a determination is made as to whether or not the viewpoint signal has been recorded after the predetermined process based on the viewpoint signal is executed in a camera, a recording medium with a large capacity is required immediately after imaging. Further, when the predetermined process based on the viewpoint signal is not executed in the camera, the viewpoint signal is unavoidably stored in the recording medium, and therefore a recording medium with a large capacity is required.

SUMMARY OF THE INVENTION

The present invention provides an imaging apparatus capable of suppressing capacity of data to be recorded.

An imaging apparatus according to the present invention includes an acquisition unit configured to acquire a plurality of viewpoint images; an imaging condition acquisition unit configured to acquire an imaging condition when the viewpoint image is captured; and a compression unit configured to compress the viewpoint image to be recorded on the recording unit. The compression unit compresses the viewpoint image according to the imaging condition.

An imaging apparatus according to the present invention includes an acquisition unit configured to acquire a plurality of viewpoint images; an imaging condition acquisition unit configured to acquire an imaging condition when the viewpoint image is captured; and a determination unit configured to determine data to be recorded on the recording unit. The determination unit determines whether the viewpoint image is to be recorded on the recording unit according to the imaging condition.

Further features of the present invention will be described from the following description of exemplary embodiments with reference to the attached drawings.

BRIEF DESCRIPTION OF THE DRAWINGS

FIGS. 16A to 16C are diagrams illustrating pupil shift at a peripheral image height of the imaging element.

DESCRIPTION OF THE EMBODIMENTS

First Embodiment

Figure 1:
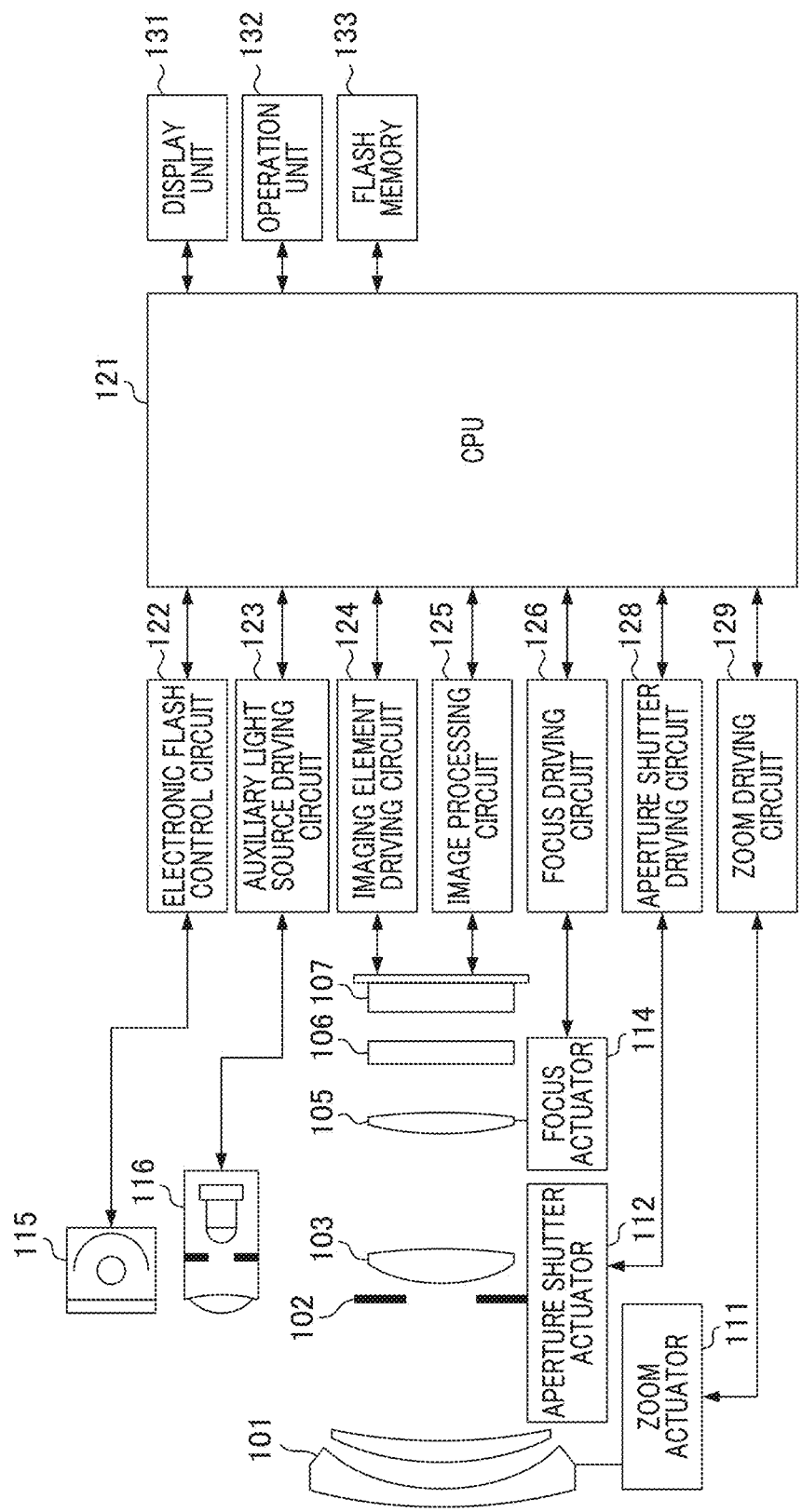
FIG. 1 is a block diagram illustrating a schematic configuration of an imaging apparatus.

FIG. 1 is a block diagram illustrating a configuration example of an imaging apparatus including imaging elements. Although an embodiment in which the present invention is applied to an imaging apparatus such as an arbitrary digital camera capable of acquiring LF data will be described below, the present invention can be widely applied to an image processing device capable of processing LF data, an information processing device, an electronic device, and the like. Further, a configuration in which arbitrary devices transmits LF data and content of an operation to a server device (including a virtual machine) including a processing unit such as a processor on a network, and some or all processes for the LF data are executed by the server device may be included.

The imaging apparatus includes a first lens group 101, an aperture/shutter 102, a second lens group 103, a third lens group 105, an optical low pass filter 106, an imaging element 107, an electronic flash 115, and an AF auxiliary light source 116. Further, the imaging apparatus includes a zoom actuator 111, an aperture shutter actuator 112, a focus actuator 114, a CPU 121, various circuits 122 to 129, a display unit 131, an operation unit 132, and a flash memory 133.

The first lens group 101 is disposed at a front end portion of an optical imaging system (an optical image forming system) and is held to be able to advance and retract in an optical axis direction in a lens barrel. The aperture/shutter 102 adjusts an aperture diameter to perform adjustment of the amount of light at the time of imaging, and has a function of an exposure time adjustment shutter in still image capturing. The second lens group 103 advances and retracts in the optical axis direction together with the aperture/shutter 102, and performs a zooming operation by interlocking with the advancing and retracting operation of the first lens group 101 to realize a zoom function. The third lens group 105 is a focus lens that performs focus adjustment by advancing and retracting in the optical axis direction. The optical low pass filter 106 is an optical element for reducing false color and moiré of a captured image. The imaging element 107 includes, for example, a two-dimensional complementary metal oxide semiconductor (CMOS) photosensor and a peripheral circuit, and is arranged on an imaging surface of the optical imaging system.

The zoom actuator 111 rotates a cam barrel of the lens barrel to move the first lens group 101 and the second lens group 103 in the optical axis direction and perform the zooming operation. The aperture shutter actuator 112 controls the aperture diameter of the aperture/shutter 102 to adjust the amount of imaging light and performs exposure time control in the still image imaging. The focus actuator 114 moves the third lens group 105 in the optical axis direction to perform a focus adjustment operation.

A flashing lighting device using a xenon tube or a lighting device including a light emitting diode (LED) that continuously emits light, which is used in imaging, is used for the electronic flash 115 for subject lighting. The AF (autofocus) auxiliary light source 116 projects an image of a mask having a predetermined aperture pattern onto a subject via a projection lens. Accordingly, a focus detection capability for low luminance subjects or low contrast subjects is improved.

A central processing unit (CPU) 121 constituting a control unit of a camera body unit includes a control function of performing various kinds of control. The CPU 121 includes, for example, a calculation unit, a read only memory (ROM), a random access memory (RAM), an analog (A)/digital (D) converter, a D/A converter, and a communication interface circuit. The CPU 121 drives various circuits in the imaging apparatus according to a predetermined program stored in the ROM and executes a series of operations such as AF control, an imaging process, image processing, and a recording process. In the AF control, focus state detection and focus control of the optical imaging system are controlled.

An electronic flash control circuit 122 controls the lighting of the electronic flash 115 in synchronization with the imaging operation according to the control instruction of the CPU 121. An auxiliary light source driving circuit 123 controls the lighting of the AF auxiliary light source 116 in synchronization with the focus detection operation according to the control command of the CPU 121. An imaging element driving circuit 124 controls the imaging operation of the imaging element 107, performs A/D conversion on the acquired imaging signal, and outputs a resultant signal to the CPU 121. An image processing circuit 125 performs processes such as gamma conversion, color interpolation, Joint Photographic Experts Group (JPEG) compression, and the like on the image acquired by the imaging element 107 according to the control instruction of the CPU 121.

The focus driving circuit 126 drives the focus actuator 114 on the basis of the focus detection result according to the control command of the CPU 121, moves the third lens group 105 in the optical axis direction, and performs focus adjustment. The aperture shutter driving circuit 128 drives the aperture shutter actuator 112 according to the control instruction of the CPU 121 and controls the aperture diameter of the aperture/shutter 102. The zoom driving circuit 129 drives the zoom actuator 111 according to the zoom operation instruction of a photographer according to the control instruction of the CPU 121.

The display unit 131 includes a display device such as a liquid crystal display device (LCD) and displays information on an imaging mode of the imaging apparatus, a preview image before imaging, an image for confirmation after imaging, an in-focus state display image used in focus detection, or the like. The operation unit 132 includes various operation switches, and outputs an operation instruction signal to the CPU 121. The flash memory 133 is a recording medium that is detachably mounted on a camera main body, and records captured image data or the like. Predetermined image data is displayed on a screen of the display unit 131 or recorded on the flash memory 133. The predetermined image data refers to, for example, a plurality of pieces of viewpoint image data processed by the image processing circuit 125 after imaging using the imaging element 107, or combined image data obtained by combining the plurality of pieces of viewpoint image data in the imaging element 107 or in the image processing circuit 125.

Figure 2:
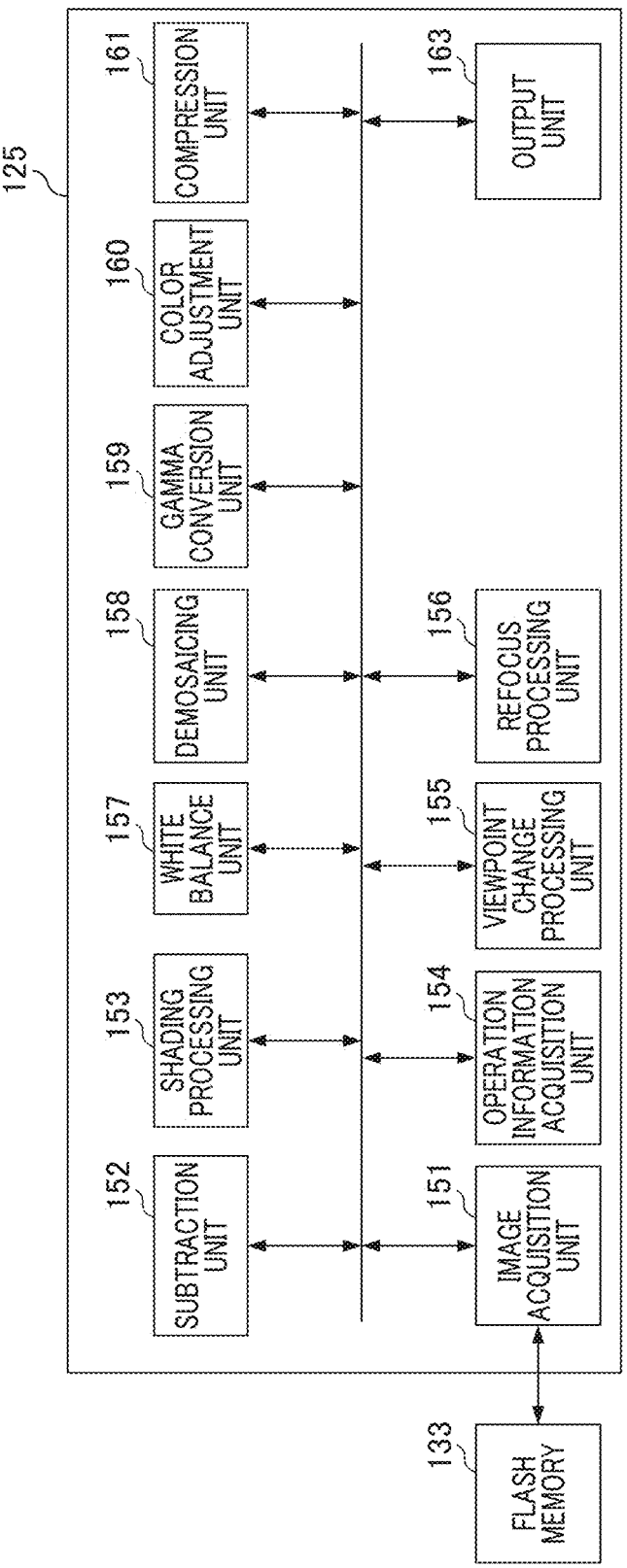
FIG. 2 is a block diagram illustrating a configuration of an image processing circuit.

FIG. 2 is a block diagram illustrating a configuration example of the image processing circuit 125. The image processing circuit 125 includes an image acquisition unit 151, a subtraction unit 152, a shading processing unit 153, an operation information acquisition unit 154, a viewpoint change processing unit 155, and a refocusing processing unit 156. Further, the image processing circuit 125 includes a white balance unit 157, a demosaicing unit 158, a gamma conversion unit 159, a color adjustment unit 160, a compression unit 161, and an output unit 163.

The image acquisition unit 151 acquires the image data from the flash memory 133 and stores the acquired image data. The image data is a captured image (A+B image) and a first viewpoint image (or a second viewpoint image) obtained by combining a first viewpoint image and a second viewpoint image to be described below. The subtraction unit 152 subtracts the first viewpoint image (A image) from the captured image (A+B image) to generate a second viewpoint image (B image).

The shading processing unit 153 corrects a change in an amount of light according to an image height of the first viewpoint image and the second viewpoint image. The operation information acquisition unit 154 receives adjustment values of viewpoint movement and focus adjustment (refocus) set by the user through a user interface. The operation information acquisition unit 154 transfers the adjustment value operated by the user to the viewpoint change processing unit 155 and the refocusing processing unit 156. Further, the operation information acquisition unit 154 also has a function of an imaging condition acquisition unit configured to acquire imaging conditions at the time of imaging. The imaging conditions include an aperture value, an ISO value, a subject distance, and the like. The viewpoint change processing unit 155 performs image processing using a plurality of viewpoint images on the basis of the adjustment value acquired from the operation information acquisition unit 154. The viewpoint change processing unit 155 changes an addition rate (weighting) of the first viewpoint image and the second viewpoint image to generate an image in which the viewpoint has been changed or an image in which the depth of field has been changed. The refocusing processing unit 156 shifts and adds the first viewpoint image and the second viewpoint image in a pupil division direction to generate a combined image and generate images at different focus positions.

Next, components for performing a development process in the image processing circuit 125 will be described. The white balance unit 157 performs white balance processing. Specifically, gain is applied to each of R, G and B so that R, G, and B in a white area become isochromatic. By performing the white balance process before the demosaicing process, it is possible to prevent saturation from being higher than saturation of a false color due to color fogging or the like at the time of calculation of the saturation, and to prevent an erroneous determination.

The demosaicing unit 158 interpolates mosaic image data of two colors among three primary colors deficient in each pixel to generate a color image in which the color image data of R, G, and B is present in all the pixels. Specifically, first, interpolation is performed on a pixel of interest in respective defined directions using pixels around the pixel of interest, and then direction selection is performed. Accordingly, a color image signal of primary colors of R, C. and B is generated as a result of the interpolation process for each pixel.

The gamma conversion unit 159 performs a gamma correction process on the color image data of each pixel to generate basic color image data. The gamma conversion unit 159, for example, generates color image data matched with display characteristics of the display unit 131 as basic color image data. The color adjustment unit 160 applies various color adjustment processes such as noise reduction, saturation enhancement, hue correction, and outline enhancement, which are processes for improving the appearance of the image, to the color image data.

The compression unit 161 compresses color-adjusted color image data using a method conforming to a predetermined compression scheme such as MEG to reduce a data size of the color image data at the time of recording. The output unit 163 outputs various types of image data such as color image data, compressed image data, and display data for a user interface to the display unit 131 of the imaging apparatus, an external display device, the flash memory 133, and the like.

Figure 3:
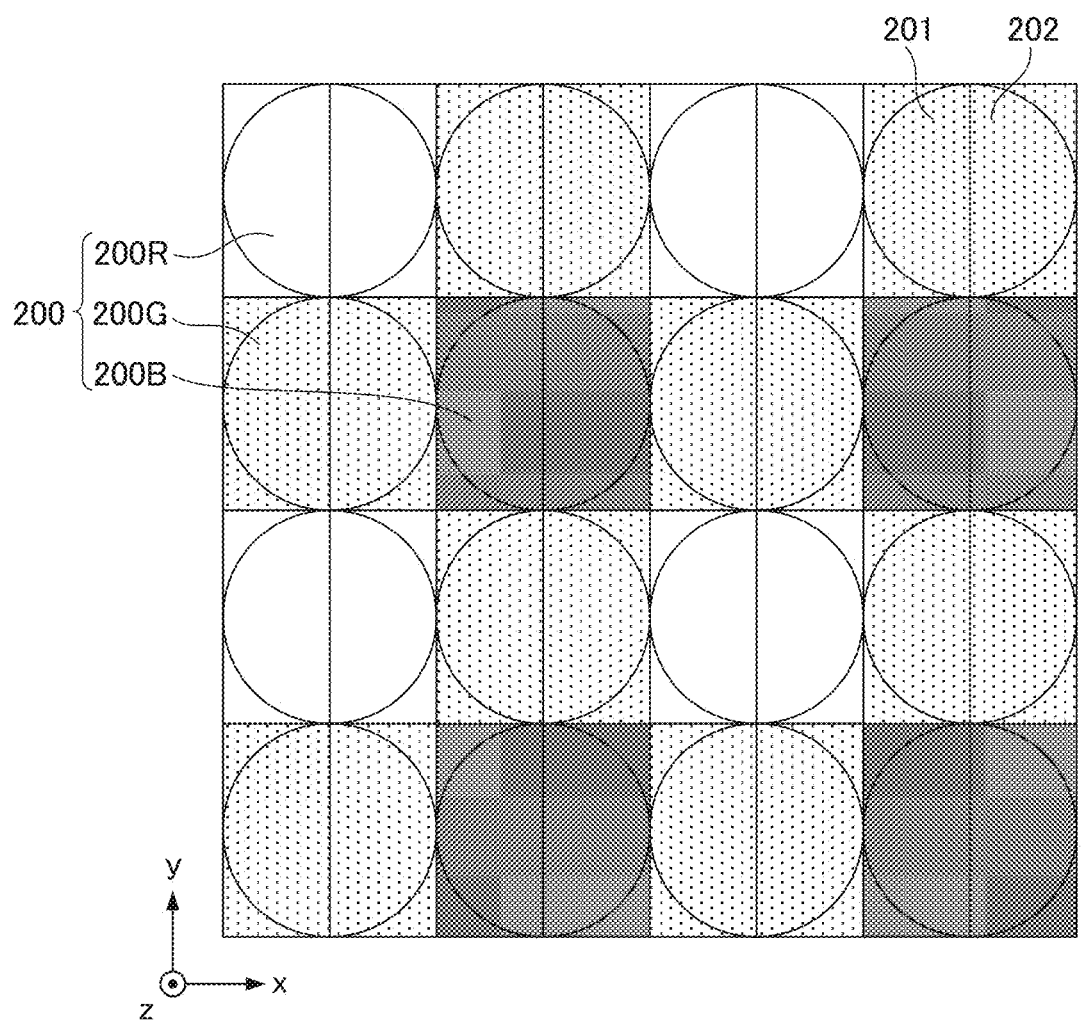
FIG. 3 is a schematic diagram of a pixel array.

FIG. 3 is a schematic diagram illustrating an array of pixels and sub-pixels of the imaging element. A horizontal direction in FIG. 3 is defined as an x-axis direction, a vertical direction is defined as a y-axis direction, and a direction orthogonal to the x-axis direction and the y-axis direction (a direction perpendicular to a paper surface) is defined as a z-axis direction. FIG. 3 illustrates a pixel array of a two-dimensional CMOS sensor (an imaging element) of the embodiment in a range of 4 columns×4 rows, and a subpixel array in a range of 8 columns×4 rows.

In a pixel 200 of 2 columns×2 rows illustrated in FIG. 3, a pixel 200R having spectral sensitivity of R (red) is arranged at an upper left position, a pixel 200G having spectral sensitivity of G (green) is arranged at an upper right position and a lower left position, and a pixel 200B having spectral sensitivity of B (blue) is arranged at a lower right position. Further, each pixel has a first subpixel 201 and a second subpixel 202 through division into two in the x-axis direction and one in the y-axis direction. That is, when the number of divisions in the x direction is denoted as Nx, the number of divisions in the y direction is denoted as Ny, and the number of divisions is denoted as NLF, Nx=2, Ny=1, NLF=Nx×Ny:=2, as illustrated in FIG. 3. Each of the subpixels has a function of a focus detection pixel that outputs a focus detection signal.

In the example illustrated in FIG. 3, by arranging a large number of pixels of 4 columns×4 rows (8 columns×4 rows of subpixels) on a surface, it is possible to acquire a signal for generating a captured image (A+B image) and a plurality of viewpoint images that are used for a display in the display unit 131, recording in the flash memory 133, or the like. In the embodiment, description will be given with reference to an imaging element in which a period P of the pixel is 4 μm, the number of pixels N is 5575 columns in a horizontal direction×3725 rows in a vertical direction=about 20.75 million pixels, a column direction period PS of the subpixels is 2 μm, and the number of subpixels NS is 11150 columns in the horizontal direction×3725 rows in the vertical direction=about 41.5 million pixels.

Figure 4A:
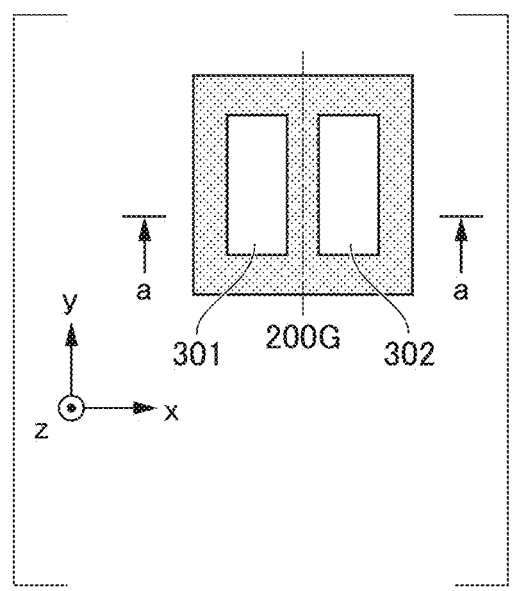
FIGS. 4A and 4B are a schematic plan view and a schematic cross-sectional view of a pixel.
Figure 4B:
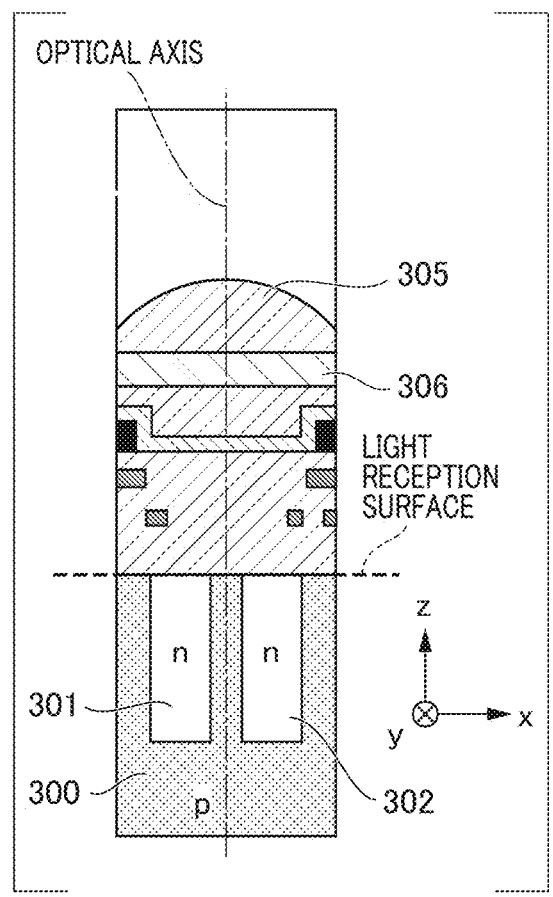

FIG. 4A is a plan view of one pixel 200G of the imaging element illustrated in FIG. 3 as seen from a light reception surface side (±z side) of the imaging element. A z axis is set in a direction perpendicular to a paper surface of FIG. 4A, and a front side is defined as a positive direction of the z axis. Further, a y axis is set in a vertical direction orthogonal to the z axis, an upward direction is defined as a positive direction of the y axis, the x axis is set in a horizontal direction orthogonal to the z axis and the y axis, and a right direction is defined as a positive direction of the x axis. FIG. 4B is a cross-sectional view when viewed from a −y side along a cutting line a-a in FIG. 4A.

As illustrated in FIGS. 4A and 4B, in the pixel 200E a microlens 305 for collecting incident light is formed on the light reception surface side (+z-axis direction) of each pixel. Further, a plurality of photoelectric conversion portions with the number of divisions of 2 divided into two in the x direction and one divided in the y direction are formed. A first photoelectric conversion portion 301 and a second photoelectric conversion portion 302 correspond to the first subpixel 201 and the second subpixel 202, respectively. It should be noted that the number of divisions of the photoelectric conversion portion (subpixel) is not limited to 2. The direction of division is not limited to the x direction but may be the v direction.

The first photoelectric conversion portion 301 and the second photoelectric conversion portion 302 are two independent pn junction photodiodes, and are photodiodes having a focus structure in which an intrinsic layer is sandwiched between a p-type layer and an n-type layer. Further, the intrinsic layer may be omitted and the diodes may be used as the pn junction photodiodes when necessary. In each pixel, a color filter 306 is formed between the microlens 305 and each of the first photoelectric conversion portion 301 and the second photoelectric conversion portion 302. Further, spectral transmittance of the color filter 306 may be changed for each pixel or each photoelectric conversion portion (for each subpixel), or the color filter may be omitted when necessary.

Light incident on the pixel 200G is condensed by the microlens 305, separated by the color filter 306, and then received by the first photoelectric conversion portion 301 and the second photoelectric conversion portion 302. In the first photoelectric conversion portion 301 and the second photoelectric conversion portion 302, pairs of electrons and holes are generated according to the amount of received light, separated by a depletion layer, and negatively charged electrons are accumulated in the n-type layer (not illustrated). On the other hand, the holes are discharged to the outside of the imaging element through the p-type layer connected to a constant voltage source (not illustrated). The electrons accumulated in the n-type layer (not illustrated) of the first photoelectric conversion portion 301 and the second photoelectric conversion portion 302 are transferred to a capacitance unit (FD) via a transfer gate, and converted into a voltage signal.

Figure 5:
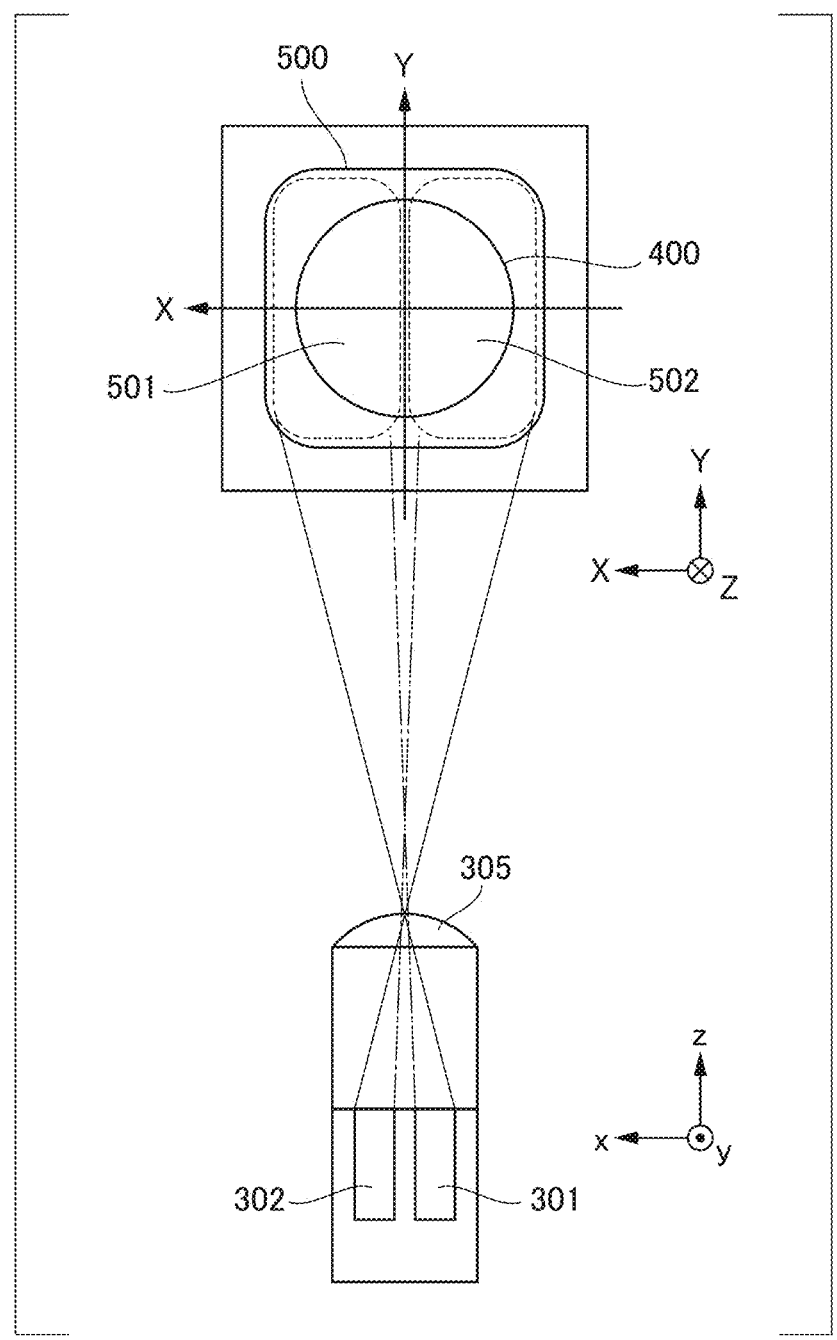
FIG. 5 is a schematic illustrative diagram of a pixel and pupil division.

FIG. 5 is a schematic illustrative diagram illustrating a correspondence relationship between a pixel structure and the pupil division. FIG. 5 illustrates a cross-sectional view of the pixel structure illustrated in FIG. 4A taken along a cutting line a-a when viewed from the +y side and a view of an exit pupil surface of the optical image forming system when viewed in the −z-axis direction. In FIG. 5, in order to correspond to a coordinate axis of the exit pupil surface, an x axis and a y axis of the cross-sectional view are inverted with respect to the states illustrated in FIGS. 4A and 4B. The imaging element is disposed near an image forming surface of the imaging lens (an optical image forming system), and a light beam from a subject passes through the exit pupil 400 of the optical image forming system and is incident on each pixel. The surface on which the imaging element is disposed is defined as an imaging surface.

A first pupil partial area 501 of the first subpixel 201 is substantially optically conjugate with the light reception surface of the first photoelectric conversion portion 301 of which a centroid is eccentric in the −x direction by the microlens 305. The first pupil partial area 501 indicates a pupil area in which light can be received by the first subpixel 201. In the first pupil partial area 501 of the first subpixel 201, the centroid is eccentric to the +X side on the pupil plane. A second pupil partial area 502 of the second subpixel 202 is substantially optically conjugate with the light reception surface of the second photoelectric conversion portion 302 of which a centroid is eccentric in the +x direction by the microlens 305. The second pupil partial area 502 indicates a pupil area in which light can be received by the second subpixel 202. In the second pupil partial area 502 of the second subpixel 202, the centroid is eccentric to the −X side on the pupil plane.

The pupil area 500 has a substantially optically conjugate relationship with the light reception surface in which both of the first photoelectric conversion portion 301 and the second photoelectric conversion portion 302 are combined by the microlens 305. The pupil area 500 is a pupil area in which light can be received by the entire pixel 200G in which both of the first subpixel 201 and the second subpixel 202 are combined.

Figure 6A:
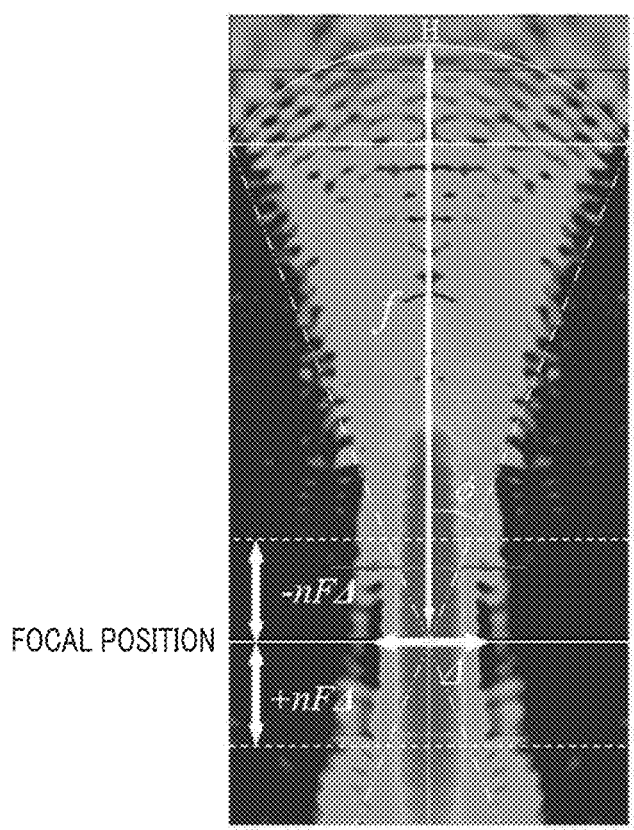
FIGS. 6A and 6B are diagrams illustrating examples of a light intensity distribution inside the pixel.
Figure 6B:
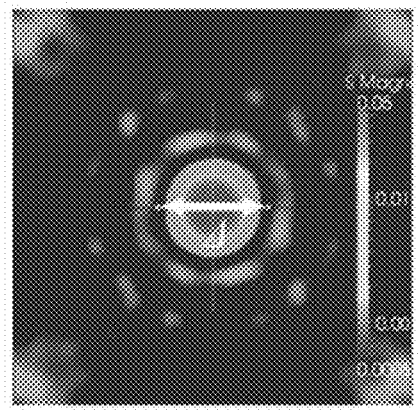

FIGS. 6A and 6B are diagrams illustrating examples of light intensity distributions when light is incident on the microlens formed in each pixel. FIG. 6A illustrates the light intensity distribution in a cross section parallel to an optical axis of the microlens. FIG. 6B illustrates the light intensity distribution in a cross section perpendicular to the optical axis of the microlens at a focal position of the microlens. The incident light is condensed on the focal position by the microlens. However, due to an influence of diffraction due to the wave nature of the light, a diameter of a focusing spot cannot be made smaller than a diffraction limit Δ and has a finite magnitude. A size of the light reception surface of the photoelectric conversion portion is about 1 to 2 µm, whereas the focusing spot of the microlens is about 1 µm. Therefore, the first pupil partial area 501 and the second pupil partial area 502 in FIG. 5 which are in a conjugate relationship via the light reception surface of the photoelectric conversion portion and the microlens are not distinctly divided into pupils due to diffraction blur, and have a light reception rate distribution (a pupil intensity distribution) that depends on an incidence angle of light.

Figure 7:
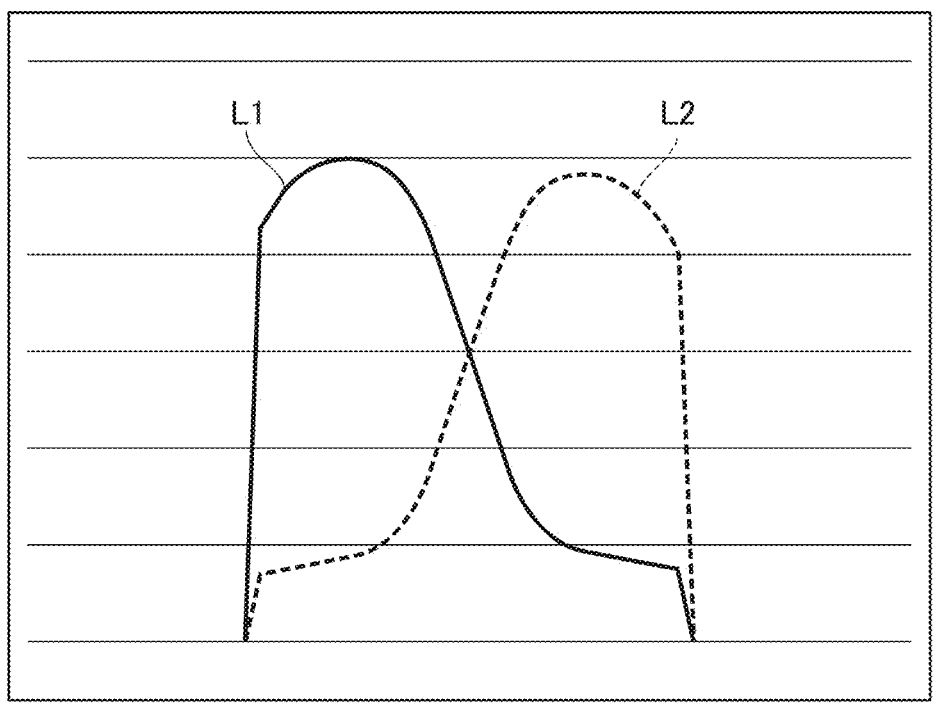
FIG. 7 is a diagram illustrating a pupil intensity distribution.

FIG. 7 is a diagram illustrating an example of the light reception rate distribution (the pupil intensity distribution) that depends on the incidence angle of light. A horizontal axis indicates pupil coordinates, and a vertical axis indicates the light reception rate. A graph line L1 indicated by a solid line in FIG. 7 denotes the pupil intensity distribution along an X axis of the first pupil partial area 501 in FIG. 5. The light reception rate indicated by the graph line L1 increases sharply from a left end, reaches a peak, gradually decreases, and then reaches a right end with a gentle change rate. Further, a graph line L2 indicated by a broken line in FIG. 7 denotes a pupil intensity distribution along the X axis of the second pupil partial area 502. The light reception rate indicated by the graph line L2 increases sharply from a right end, reaches a peak, gradually decreases, and then reaches a left end with a gentle change rate, which is opposite (bilaterally symmetrical) to the graph line L1. As illustrated in FIG. 7, it can be seen that the pupil division is gently performed.

Figure 8:
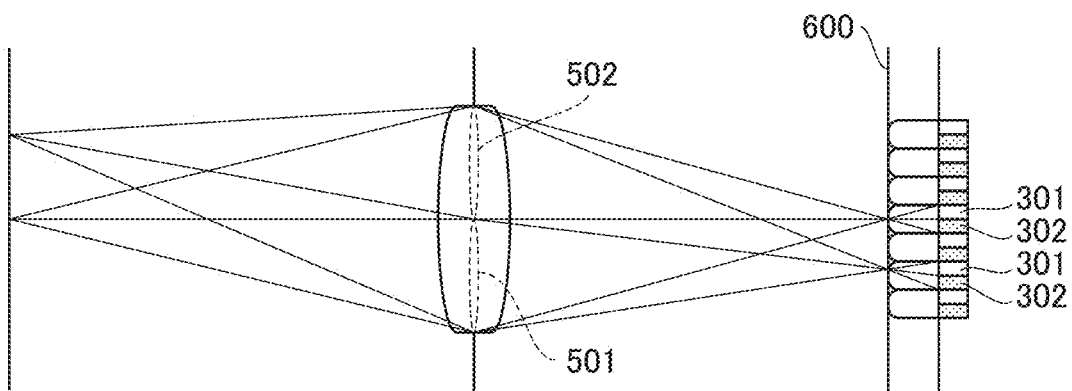
FIG. 8 is a schematic illustrative diagram of an imaging element and pupil division.

FIG. 8 is a schematic diagram illustrating a correspondence relationship between the imaging element and the pupil division. The first photoelectric conversion portion 301 and the second photoelectric conversion portion 302 correspond to the first subpixel 201 and the second subpixel 202, respectively. In each pixel of the imaging element, the first subpixel 201 and the second subpixel 202 divided into 2×1 receive a light beam that has passed through the different pupil partial areas of the first pupil partial area 501 and the second pupil partial area 502 of the optical image forming system. That is, the light beams having passed through the different pupil partial areas including the first pupil partial area 501 and the second pupil partial area 502 are incident on the respective pixels of the imaging element at different angles, and are received by the first subpixel 201 and the second subpixel 202 divided into 2×1.

By selecting a signal of a specific subpixel from the first subpixel 201 and the second subpixel 202 for each pixel from the signal received by each subpixel, a viewpoint image corresponding to a specific pupil partial area among the first pupil partial area 501 and the second pupil partial area. 502 of the optical image forming system can be generated. For example, by selecting the signal of the first subpixel 201 in each pixel, a first viewpoint image having a resolution of the number of pixels N corresponding to the first pupil partial area 501 of the optical image forming system can be generated. The same applies to other subpixels. The imaging element of the embodiment has a structure in which the plurality of pixels in which a plurality of photoelectric conversion portions (subpixels) that receive a light beam passing through different pupil partial areas of the optical image forming system are provided are arranged, and can generate a plurality of viewpoint images for every different pupil partial area.

In the embodiment, each of the first viewpoint image and the second viewpoint image is a Bayer array image. A demosaicing process may be performed on the first viewpoint image and the second viewpoint image when necessary. Further, it is possible to generate a captured image with a resolution of the effective pixel number N by adding and reading the signals of the first subpixel 201 and the second subpixel 202 for each pixel of the imaging element.

Figure 9:
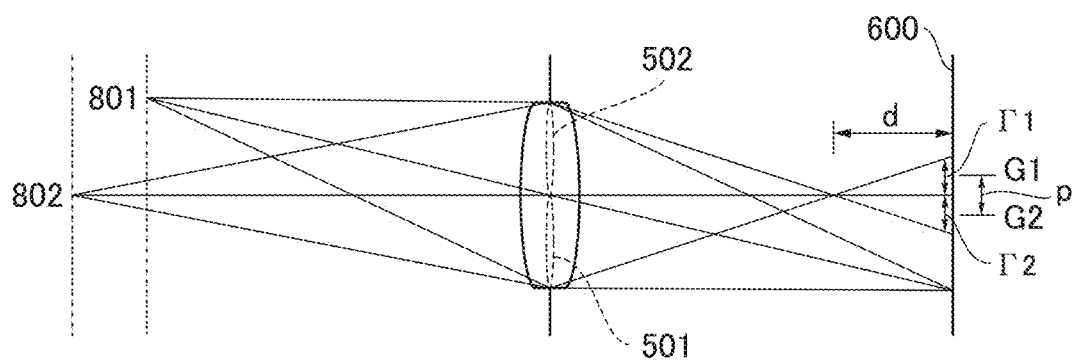
FIG. 9 is a schematic diagram illustrating a relationship between the amount of defocus and the amount of image shift.

Next, a relationship between the amount of defocus and an amount of image shift of the first viewpoint image and the second viewpoint image acquired by the imaging element of the embodiment will be described. FIG. 9 is a diagram illustrating an approximate relationship between the amount of defocus of the first viewpoint image and the second viewpoint image and the amount of image shift between the first viewpoint image and the second viewpoint image. The imaging element (not illustrated) is disposed on the imaging surface 600, and the exit pupil of the optical image forming system is divided into 2×1, that is, into the first pupil partial area 501 and the second pupil partial area 502, as in FIGS. 5 and 8.

A magnitude |d| of the amount of defocus d indicates a distance from an imaging position of a subject image to the imaging surface 600. A direction is defined by defining a front focus state in which an imaging position of the subject is on the subject side from the imaging surface as negative (d<0), and defining a rear focus state in which the imaging position of the subject is on the opposite side of the subject from the imaging surface as positive (d>0). An in-focus stale in which the imaging position of the subject is at the imaging surface (in-focus position) is d=0. FIG. 9 illustrates an example in which the subject 801 is at a position corresponding to the in-focus state (d=0), and illustrates an example in which the subject 802 is at a position corresponding to the front focus state (d<0). Hereinafter, the front focus state (d<0) and the rear_focus state (d>0) are collectively referred to as a defocus state (|d|>0).

In the front focus state (d<0), the light beam that has passed through the first pupil partial area 501 (or the second pupil partial area 502) among the light beams from the subject 802 is condensed once and then spreads to a width Γ1 (Γ2) around a centroid position G1 (G2) of the light beam. In this case, a blurred image is formed on the imaging surface 600. The blurred image is received by the first subpixel 201 (or the second subpixel 202) constituting each pixel arranged in the imaging element, and the first viewpoint image (or the second viewpoint image) is generated. Therefore, in the first viewpoint image (or the second viewpoint image), the subject 802 is recorded as image data of the subject image (blurred image) having a blur width Γ1 (Γ2) at a centroid position G1 (or G2) on the imaging surface 600.

The blur width Γ1 (or Γ2) of the subject image increases substantially in proportion as the magnitude |d| of the amount of defocus d increases. Similarly, a magnitude |p| of the amount of image shift p (=a difference G1–G2 between centroid positions of the light beams) of the subject image between the first viewpoint image and the second viewpoint image also increases substantially in proportion as the magnitude |d| of the amount of defocus d increases. It should be noted that in the rear focus state (d>0), an image shift direction of the subject image between the first viewpoint image and the second viewpoint image is opposite to the front focus state, but there is the same tendency.

Therefore, in the embodiment, as the magnitude of the amount of defocus of the first viewpoint image and the second viewpoint image or an imaging signal obtained by adding the first viewpoint image and the second viewpoint image increases, a magnitude of the amount of image shift between the first viewpoint image and the second viewpoint image increases.

Next, image processing using viewpoint images will be described. The image processing using viewpoint images includes refocusing processing, a viewpoint movement process, blurring adjustment, an unnecessary component reduction process, and the like.

The viewpoint image correction process and the refocusing process will be described. In the refocusing process of the embodiment, the process of three steps is executed. In the first step, the viewpoint change processing unit 155 calculates a contrast distribution representing a contrast level based on each pixel value of the captured image. In the second step, the viewpoint change processing unit 155 performs conversion to enlarge a difference between a plurality of viewpoint images first viewpoint image and a second viewpoint image) for each pixel and enhance a parallax on the basis of the contrast distribution calculated in the first step. A plurality of corrected viewpoint images (a first corrected viewpoint image and a second corrected viewpoint image) are generated through the process of the second step. In the third step, the refocusing processing unit 156 relatively shifts and adds the plurality of corrected viewpoint images (the first corrected viewpoint image and the second corrected viewpoint image) to generate a refocused image.

Hereinafter, a j-th position in a row direction and an i-th position in a column direction of the imaging element 107 are denoted as (j, i). j and i are integer variables. Further, a first viewpoint image of a pixel at position (j, i) is denoted as A0(j, i) and a second viewpoint image is denoted as B0(j, i). A captured image is denoted as I(j, i), and I(j, i)=A0(j, i)+B0(j, i).

First, the calculation of the contrast distribution will be described. The viewpoint change processing unit 155 matches a color centroid of each of RGB with the captured image I(j, i) of a Bayer array for each position (j, i) according to Equation (1) to calculate a luminance Y(j, i).

$$Y(j, i) = [0.25 * I(j-1, i-1) + 0.5 * I(j-1, i) + 0.25 * I(j-1, i+1) + \quad (1)$$
$$0.5 * I(j, i-1) + 1.0 * I(j, i) + 0.5 * I(j, i+1) +$$
$$0.25 * I(j+1, i-1) + 0.5 * I(j+1, i) + 0.25 * I(j+1, i+1)]/4$$

Next, the viewpoint change processing unit 155 performs Laplacian filter processing such as [1, 2, −1, −1, 2, 1] on the luminance Y (j, i) in a horizontal direction (column i direction) which is a pupil division direction to calculate a high-frequency component dY(j, i) in the horizontal direction. The viewpoint change processing unit 155 may perform high-frequency cut filter processing such as [1, 1, 1, 1, 1, 1, 1] in a vertical direction (row j direction) that is not the pupil division direction to suppress high frequency noise in the vertical direction as necessary.

Then, the viewpoint change processing unit 155 calculates a standardized (normalized) high-frequency component dZ(j, i) in the horizontal direction according to Equation (2). Here, by adding a nonzero constant Y0 to a denominator, divergence of Equation (2) due to division by 0 is prevented. The viewpoint change processing unit 155 may perform high-frequency cut filter processing on the luminance Y(j, i) to suppress high frequency noise before normalizing using Equation (2) as necessary.

$$dZ(j,i)=dY(j,i)/(Y(j,i)+Y_0) \quad (2)$$

The viewpoint change processing unit 155 calculates a contrast distribution C(j, i) according to Equation (3). The first row of Equation (3) shows that the contrast distribution C(j, i) is set to 0 when the luminance of the captured image is smaller than a predetermined luminance Yc and is low luminance. On the other hand, the third row of Equation (3) shows that the contrast distribution C(j, i) is 1 when the normalized high frequency component dZ(j, i) is greater than a predetermined value Zc. In other cases, the second row of Equation (3) shows that the value normalized by dividing dZ(j, i) by Zc becomes the contrast distribution C(j, i).

$$C(j, i) = \begin{cases} 0 & (Y(j, i) < Y_c) \\ dZ(j, i)/Z_c & (dZ(j, i) \le Z_c) \\ 1 & (dZ(j, i) > Z_c) \end{cases} \quad (3)$$

Thus, the contrast distribution C(j, i) has a value in a range of [0, 1] (equal to or greater than 0 and equal to or smaller than 1). The equation indicates that the contrast is lower as the value of C(j, i) is closer to 0, and the contrast is higher as the value of C(j, i) is closer to 1.

Figure 10:
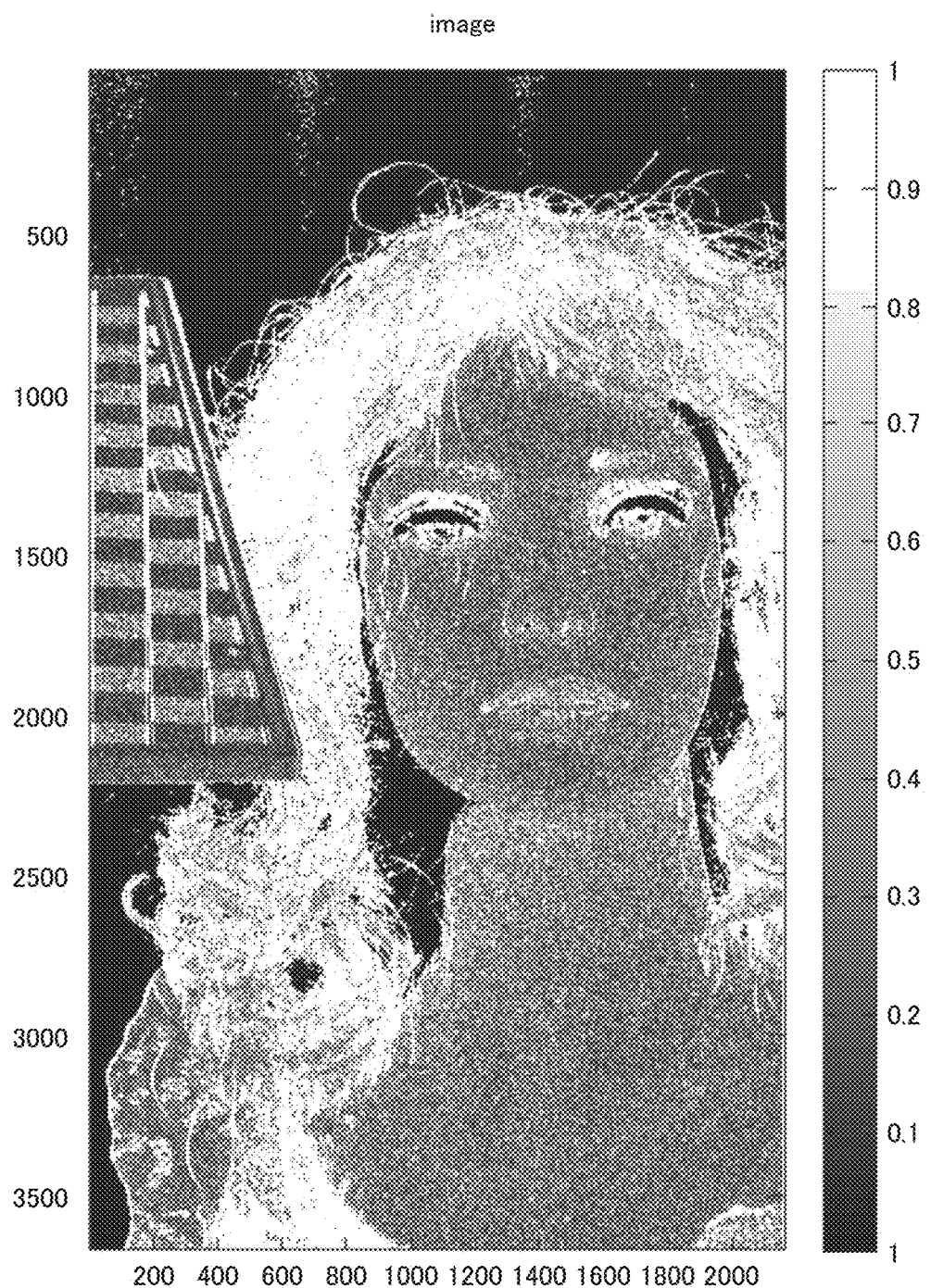
FIG. 10 is a diagram illustrating an example of a contrast distribution of a captured image.

FIG. 10 is a diagram illustrating an example of the contrast distribution C(j, i) of the captured image obtained using Equation (3). In a distribution diagram illustrated in FIG. 10, an indicator of a level of contrast is indicated by a gray scale display on the right side. A white portion indicates that there are a large number of high-frequency components in the horizontal direction and the contrast is high, and a black portion indicates that there are a small number of high-frequency components in the horizontal direction and the contrast is low.

Next, a parallax enhancement process will be described. In the parallax enhancement process, the image shift distribution of the viewpoint image is first calculated. The image shift distribution is calculated by performing correlation calculation on a pair of images of the first viewpoint image A0 and the second viewpoint image B0 to calculate the amount of relative positional shift of the pair of images. Various known methods are known for the correlation calculation, but the viewpoint change processing unit 155, for example, adds absolute values of the differences between a pair of images as shown in Equation (4) to calculate a correlation value of the image.

$$k \ge 0 \quad COR(k) = \sum_{i}^{ni} |A0_{i+k} - B0_i| \quad (4)$$
$$k < 0 \quad COR(k) = \sum_{i}^{ni} |A0_i - B0_{i+k}|$$

Here, $A0_i$ and $B0_i$ denote the luminance of the i-th pixels of the first viewpoint image A0 and the second viewpoint image B0, respectively. Further, ni is a number representing the number of pixels used for calculation and is appropriately set according to a minimum calculation range of the image shift distribution.

The viewpoint change processing unit 155, for example, calculates k at which COR(k) in Equation (4) is minimized as the amount of image shift. That is, in a state in which a pair of images are shifted by k pixels, the absolute value of the difference between the i-th A0 pixel and the B0 pixel in the row direction is obtained and the absolute value is added for a plurality of pixels in the row direction. The viewpoint change processing unit 155 regards the added value, that is, k at which COR(k) is minimized, as the amount of image shift of A0 and B0, and calculates a pixel with the amount of shift k.

On the other hand, when the two-dimensional image is moved by k pixels only in the pupil division direction to obtain the difference between the pixel of the first viewpoint image A0 and the second viewpoint image B0 and addition is performed for a plurality of columns, correlation calculation is defined by Equation (5).

$$k \ge 0 \quad COR(k) = \sum_{j}^{nj} \sum_{i}^{ni} |A0_{(i+k)j} - B0_{ij}| \quad (5)$$
$$k < 0 \quad COR(k) = \sum_{j}^{nj} \sum_{i}^{ni} |A0_{ij} - B0_{(i+k)j}|$$

Here, $A0_{ij}$ and $B0_{ij}$ denote luminances of an i-th pixel in a j-th column of the first viewpoint image A0 and the second viewpoint image B0, respectively. Further, ni denotes the number of pixels used for calculation, and nj denotes the number of columns in a column direction of a pair of images on which a correlation calculation is performed.

The viewpoint change processing unit 155 calculates k at which COR(k) of Equation (5) is minimized as the amount of image shift, as in Equation (4). It should be noted that a subscript k is added only to i and is irrelevant to j. This corresponds to performing correlation calculation while moving a two-dimensional image only in the pupil division direction. The viewpoint change processing unit 155 calculates the amount of image shift of each area of the first viewpoint image A0 and the second viewpoint image B0 according to Equation (5), and calculates the image shift distribution. It should be noted that in the refocusing process of this embodiment to be described below, sharpness processing to be described below is performed only on a high contrast portion to perform the refocusing process. Therefore, in the process of calculating the contrast distribution described above, the correlation calculation according to Equation (5) may not be performed in an area in which the contrast distribution C(j, i) is 0 (that is, a position at which the luminance is lower than a predetermined luminance Yc).

Next, an example of a specific parallax enhancement process will be described. As shown in the example of the pupil intensity distribution in FIG. 7, in the pupil division using the microlens formed in each pixel and the photoelectric conversion portion divided into a plurality of portions, gentle pupil division is performed due to diffraction blur. Therefore, the point image of the plurality of viewpoint images (the first viewpoint image and the second viewpoint image) is also gently divided, it is difficult for the parallax to occur, and the effective F value in the pupil division direction does not become sufficiently dark (great). Accordingly, it is difficult for the effective depth of focus to be deeper. Therefore, in the embodiment, the viewpoint change processing unit 155 performs a process of enlarging the difference between the viewpoint images for each pixel to enhance the parallax on the plurality of viewpoint images (the first viewpoint image and the second viewpoint image). A plurality of corrected viewpoint images (the first corrected viewpoint image and the second corrected viewpoint image) are generated through the process of enhancing this parallax.

The viewpoint change processing unit 155 performs a process of enlarging the difference between the viewpoint images according to Equations (6) and (7) and enhancing the parallax on the first viewpoint image $A_0(j, i)$ and the second viewpoint image $B_0(j, i)$. The first corrected viewpoint image i) and the second corrected viewpoint image B(j, i) are generated. Here, a coefficient k is a real number satisfying "0≤k≤1", and a coefficient α is a real number satisfying "0≤α≤1".

$$A_1(j, i) = k_1 * A_0(j, i) + k_2 * B_0(j, i),$$
$$B_1(j, i) = k_2 * A_0(j, i) + k_1 * B_0(j, i),$$
$$k_1 = \frac{1-k}{1-2k}, k_2 = -\frac{k}{1-2k}$$ (6)

$$A(j, i) = \frac{|A_1(j, i)| + A_1(j, i)}{2} + \alpha * \frac{|B_1(j, i)| - B_1(j, i)}{2},$$
$$B(j, i) = \frac{|B_1(j, i)| + B_1(j, i)}{2} + \alpha * \frac{|A_1(j, i)| - A_1(j, i)}{2}.$$ (7)

It should be noted that $k_1$, $k_2$, A1(j, i) and B1(j, i) are variables that are defined by Equation (6) in a process of calculating the first corrected viewpoint image A(j, i) and the second corrected viewpoint image B(j, i). $A_1(j, i)$ is calculated as a sum of terms obtained by multiplying the first viewpoint image $A_0(j, i)$ and the second viewpoint image $B_0(j, i)$ by $k_1$ and $k_2$. Further, B1j, i) is calculated as a sum of terms obtained by multiplying the first viewpoint image $A_0(j, i)$ and the second viewpoint image $B_0(j, i)$ by $k_2$ and The corrected viewpoint images are calculated by a sum of the first term on the right side and the second term on the right side of Equation (7), That is, the first term on the right side is a term indicating an average value of $A_1(j, i)$ or $B_1(j, i)$ and absolute values thereof. The second term on the right side is a term obtained by dividing a difference between the absolute value of $B_1(j, i)$ or $A_1(j, i)$ and $B_1(j, i)$ or $A_1(j, i)$ by 2 and multiplying a result of the division by the coefficient α.

Figure 11:
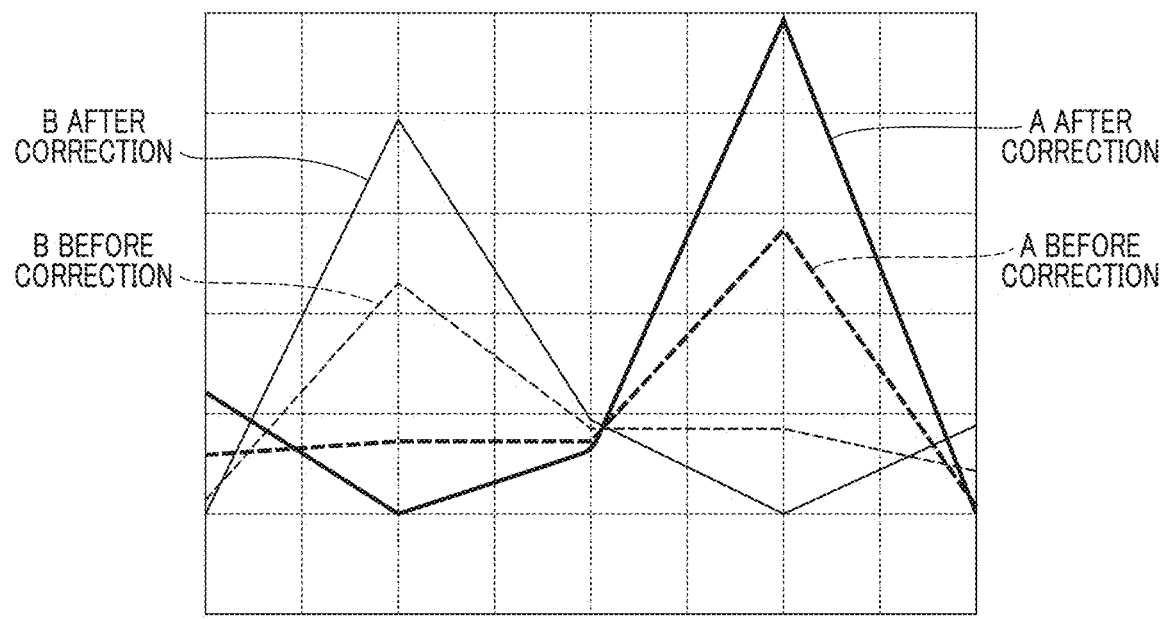
FIG. 11 is a diagram illustrating an example of parallax enhancement in which a difference between viewpoint images is enlarged.

FIG. 11 is a diagram illustrating an example in which the difference between the viewpoint images is enlarged through the parallax enhancement process. A horizontal axis indicates 1152nd to 1156th pixels in units of subpixels, and a vertical axis indicates a magnitude in parallax in each pixel. That is, the horizontal axis indicates the pixel position and the vertical axis indicates the pixel value (signal level). In FIG. 11, the first viewpoint image $A_0$ (A before correction) and the second viewpoint image $B_0$ (B before correction) before the parallax enhancement process is performed are indicated by broken lines. Further, examples of the first corrected viewpoint image A (A after correction) and the second corrected viewpoint image B (B after correction) after the parallax enhancement process is performed according to Equations (4) and (5) are shown by solid lines. A portion in which the difference between the viewpoint images is great before the conversion is further enlarged so that the parallax is enhanced, but a portion in which the difference between the viewpoint images is small before the conversion is not changed much.

As described above, in the embodiment, the viewpoint change processing unit 155 generates a plurality of corrected viewpoint images through a process of enlarging the difference between the plurality of viewpoint images and enhancing the parallax for each of the plurality of viewpoint images. The viewpoint change processing unit 155 performs conversion by performing weighting calculation between signals of a plurality of subpixels included in the pixel, as expressed by Equations (6) and (7), in order to suppress a load of the parallax enhancement process.

In Equation (6), when the value of k is increased and a degree of parallax enhancement through conversion is increased, the parallax between the plurality of corrected viewpoint images (the first corrected viewpoint image and the second corrected viewpoint image) increases, and the effective F value in the division direction can be deeply corrected. On the other hand, when the degree of parallax enhancement is excessively increased, noise of the corrected viewpoint image increases and an S/N ratio (a signal-to-noise ratio) decreases. Therefore, in the embodiment, strength of conversion of the parallax enhancement is adaptively adjusted for each area on the basis of the contrast distribution C(j, i). That is, the viewpoint change processing unit 155 performs adjustment to increase the degree of parallax enhancement in order to increase the parallax and darken (increase) the effective F value in the division direction in an area in which the contrast is relatively high. On the other hand, in an area in which the contrast is low, the viewpoint change processing unit 155 performs adjustment to weaken the intensity of parallax enhancement in order to maintain the S/N ratio. Accordingly, it is possible to suppress a decrease in the S/N ratio and improve a refocusing effect.

The viewpoint change processing unit 155 performs a process of strongly adjusting strength of the parallax enhancement in the area with higher luminance than the low-luminance area of the captured image to suppress S/N decrease if necessary. Further, it is possible to suppress a decrease in S/N by performing a process of adjusting the intensity of parallax enhancement more strongly in an area in which there are more high-frequency components of the captured image than an area in which there are few high-frequency components of the captured image as necessary. As described above, by increasing the parallax between the plurality of corrected viewpoint images (the first corrected viewpoint image and the second corrected viewpoint image), it is possible to make the effective F value in a dividing direction darker (greater) and deeply correct the effective depth of focus in the dividing direction. Further, in the refocusing process to be described below, a refocused image is generated using a plurality of corrected viewpoint images (the first corrected viewpoint image and the second corrected viewpoint image), thereby improving the refocusing effect (enhancing a change in the image due to refocusing).

Figure 12:
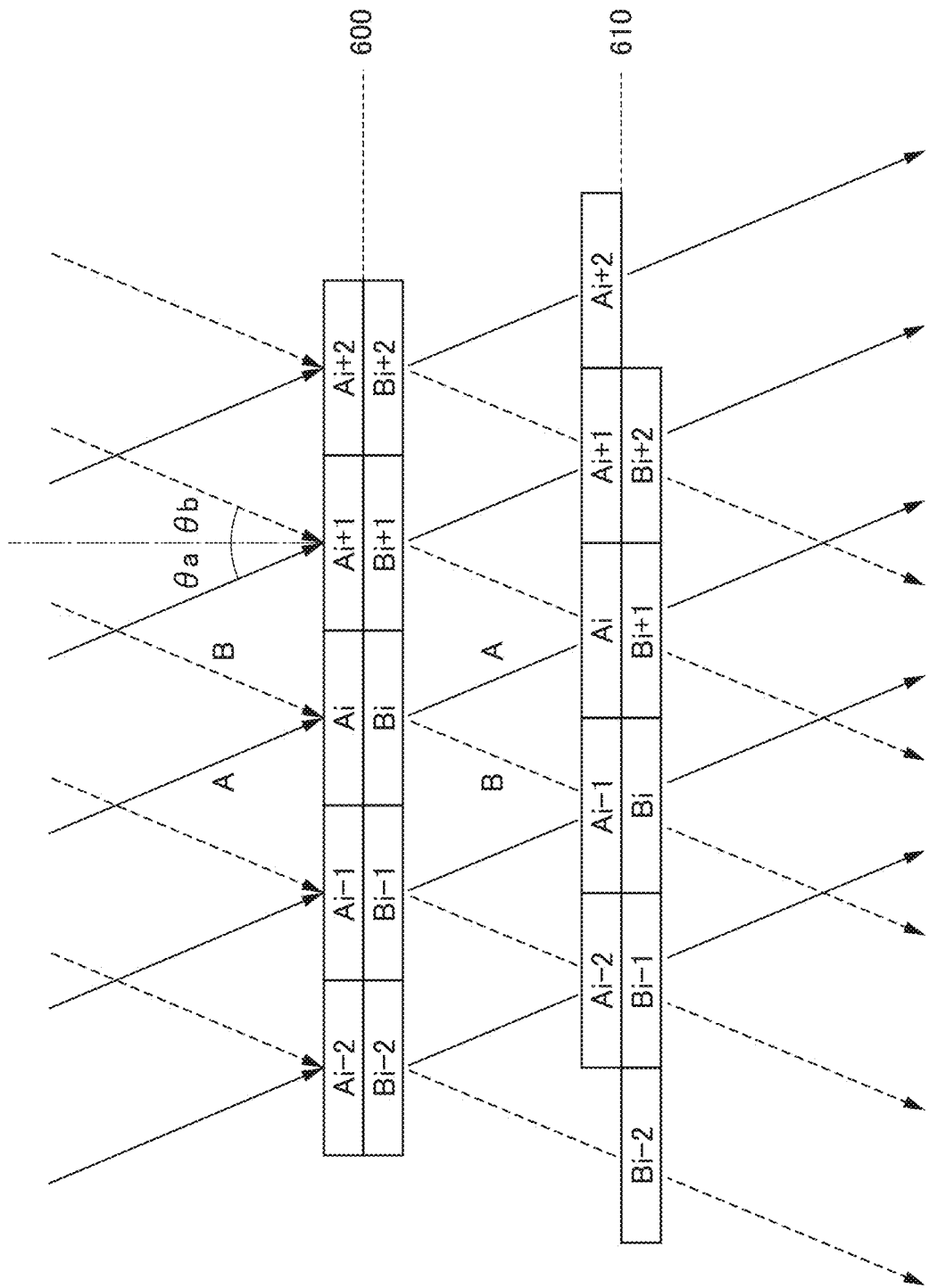
FIG. 12 is a diagram illustrating an outline of a refocusing process.

Next, a refocusing process will be described. FIG. 10 is an illustrative diagram schematically illustrating a refocusing process (a third generating process) the pupil division direction (a horizontal direction) using a plurality of corrected viewpoint images (the first corrected viewpoint image and the second corrected viewpoint image). An imaging surface 600 in FIG. 12 corresponds to the imaging surface 600 illustrated in FIG. 8. In FIG. 12, the outline is schematically illustrated, in which i is an integer variable, the first corrected viewpoint image of the i-th pixel in the column direction of the imaging element disposed on the imaging surface 600 is denoted by Ai, and the second corrected viewpoint image is denoted by Bi. The first corrected viewpoint image Ai includes a received light signal of the light beam incident on the i-th pixel at a main ray angle θa (corresponding to the first pupil partial area 501 in FIG. 8). The second corrected viewpoint image Bi includes the received light signal of the light beam incident on the i-th pixel at a main ray angle θb (corresponding to the second pupil partial area 502 in FIG. 8). That is, the first corrected viewpoint image Ai and the second corrected viewpoint image Bi also have incidence angle information, in addition to light intensity distribution information.

The first corrected viewpoint image Ai and the second corrected viewpoint image Bi have not only the light intensity distribution information but also the incidence angle information. Therefore, the refocusing processing unit 156 can generate a refocused image on a predetermined virtual image forming surface (a virtual image forming surface 610). The refocusing processing unit 156 generates a refocus signal on the virtual image forming surface 610 by performing a translating process and an addition process.

Specifically, first, the refocusing processing unit 156 performs a process of translating the first corrected viewpoint image Ai to the virtual image forming surface 610 along the main ray angle θa and translating the second corrected viewpoint image Bi to the virtual image forming surface 610 at the main ray angle θb. Then, the refocusing processing unit 156 performs a process of adding the first corrected viewpoint image Ai and the second corrected viewpoint image Bi which have been translated.

Translating the first corrected viewpoint image Ai to the virtual image forming surface 610 at the angle θa corresponds to shifting the first corrected viewpoint image Ai by +0.5 pixels in the column direction. Further, translating the second corrected viewpoint image Bi to the virtual image forming surface 610 at the angle θb corresponds to shifting the second corrected viewpoint image Bi by −0.5 pixels in the column direction. Therefore, a refocus signal on the virtual image forming surface 610 can be generated by relatively shifting the first corrected viewpoint image Ai and the second corrected viewpoint image Bi by +1 pixel and adding Ai and Bi+1 corresponding to each other. That is, a refocused image on each virtual image forming surface according to the integer amount of shift can be generated by shifting the first corrected viewpoint image Ai and the second corrected viewpoint image Bi by an integer number of pixels and performing addition for each pixel.

The refocusing processing unit 156 shifts and adds the first corrected viewpoint image A and the second corrected viewpoint image B according to Equation (8), to generate a refocused image I(j, I; s) on each virtual image forming surface corresponding to an integer amount of shift s.

$$A(j,i;s)=A(j,i)+B(j,i+s) \quad (8)$$

In the embodiment, since the first corrected viewpoint image A and the second corrected viewpoint image B are formed as a Bayer array, the refocusing processing unit 156 performs shift addition according to Equation (8) for each same color with the amount of shift s of the multiple of 2=2n (n: integer). That is, the refocusing processing unit 156 generates a refocused image I(j, i; s) while maintaining the Bayer array of the image, and then performs a demosaicing process on the generated refocused image I(j, i; s).

It should be noted that the refocusing processing unit 156 may first perform a demosaicing process on the first corrected viewpoint image A and the second corrected viewpoint image B as necessary, and perform a shift addition process using the first corrected viewpoint image and the second corrected viewpoint image after the demosaicing process. Further, the refocusing processing unit 156 may generate an interpolation signal between pixels of the first corrected viewpoint image A and the second corrected viewpoint image B as necessary, and generate a refocused image according to a non-integer amount of shift. Thus, it is possible to generate a refocused image in which the position of the virtual image forming surface is changed with more detailed granularity.

Next, a sharpness processing that the refocusing processing unit 156 applies to generate a more effective refocused image will be described. The sharpness process is a process of performing outline enhancement of a subject. As described above, in the refocusing process, the first corrected viewpoint image A and the second corrected viewpoint image B are shifted and added, and the refocused image on the virtual image forming surface is generated. Since the images of the first corrected viewpoint image A and the second corrected viewpoint image B are shifted by the shift addition, the amount of relative shift (also referred to as the amount of image shift) with respect to the image before the refocusing process can be known. The integer amount of shift s through the refocusing process corresponds to this amount of image shift. The refocusing processing unit 156 can realize the outline enhancement of the subject in the refocused image by performing the sharpness process on the area corresponding to the amount of image shift s.

Figure 13:
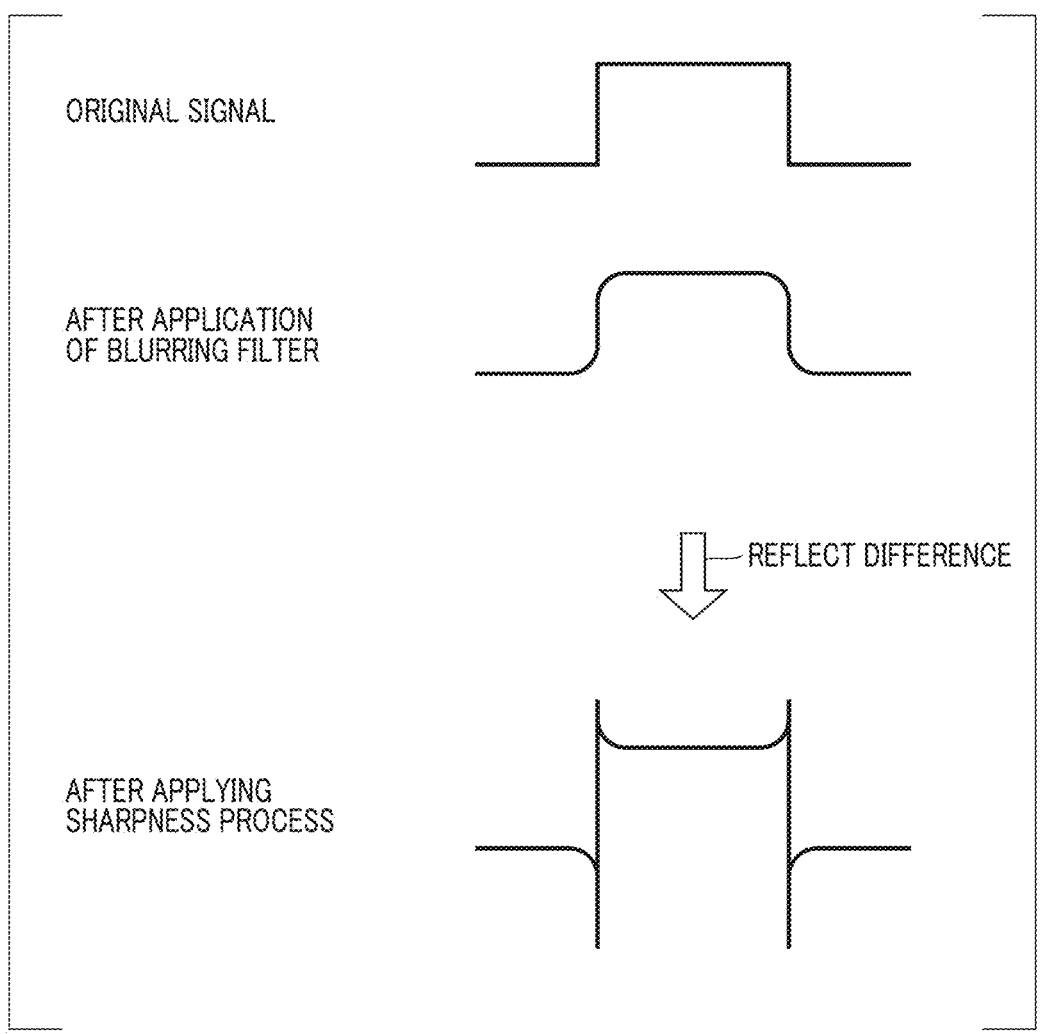
FIG. 13 is a diagram illustrating an outline of unsharpness processing.

In the embodiment, for example, unsharp mask processing is used as the sharpness process. FIG. 13 is a diagram illustrating an outline of the unsharp mask processing. In the unsharp mask processing, a blurring filter is applied to a local area (original signal) centered on the pixel of interest, and a signal after application of the blurring filter is generated. A difference between pixel values before and after the blurring processing is applied is reflected in a pixel value of the pixel of interest, thereby realizing the outline enhancement.

The unsharp mask processing performed on the pixel value P that is a processing target is calculated according to Equation (9). In Equation (9), P'(i, j) indicates the pixel value after processing application, R indicates a radius of the blurring filter, and T(i, j) indicates the amount of application (%). A magnitude of the radius R of the blurring filter is related to a wavelength of a frequency on the image to which the sharpness process is desired to be applied. That is, fine patterns are enhanced as R is smaller, and gentle patterns are enhanced as R is larger.

$$P'(i,j)=P(i,j)+(P(i,j)-F(i,j,R))\times T(i,j)/100 \quad (9)$$

F(i, j, R) indicates a pixel value obtained by applying the blurring filter with the radius R to the pixel P (i, j). For the blurring filter, a known method such as Gaussian blurring can be used. The Gaussian blurring is a process of applying a weight according to a Gaussian distribution in accordance with a distance from the pixel that is a processing target and performing averaging, and it is possible to obtain natural processing results.

The amount of application T(i, is a value that changes the amount of application of outline enhancement through the unsharp mask processing according to the image shift distribution. The amount of image shift at the position of each pixel is defined as pred(i, j) and is set as the amount of shift s by the refocusing process. In an area in which |s-pred(i, j)| is small (for example, when the amount of image shift is equal to or smaller than one pixel), that is, an area in which the in-focus state is obtained on the virtual image forming surface, the amount of application T is increased. On the other hand, in an area in which |s-pred(i, j)| is great (for example, when the amount of image shift is 3 or more pixels), the amount of application T is decreased. Thus, it is possible to enhance the outline at the focus position at which the amount of defocus is small or in an area near the in-focus position, and not to apply the unsharp mask process to the blur area in which the amount of defocus is large. That is, it is possible to further enhance the effect of the movement of the focus position through the refocusing process.

Figure 14:
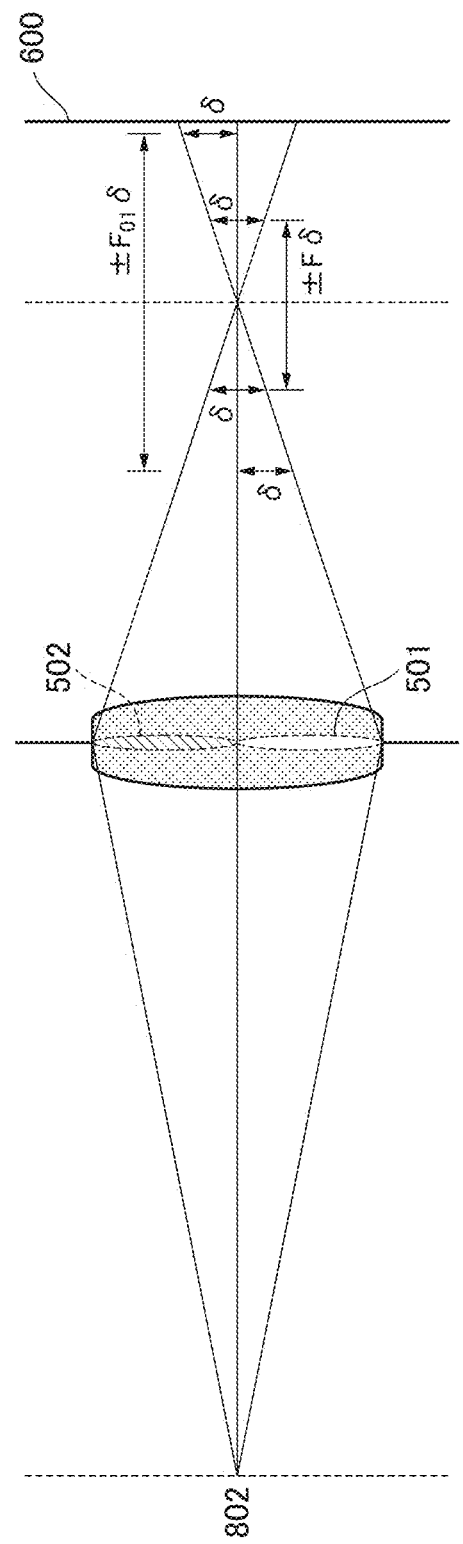
FIG. 14 is a diagram illustrating a refocusable range.

Next, a refocusable range will be described. The refocusable range is a range of focus position that can be changed through the refocusing process. FIG. 14 is a diagram schematically illustrating the refocusable range according to this example. When an allowable confusion circle is δ and the aperture value of the optical image forming system is F, the depth of field at the aperture value F is ±F×δ. On the other hand, an effective aperture value $F_{01}$ (or $F_{02}$) in the horizontal direction of the first pupil partial area 501 (or the second pupil partial area 502) narrowed by being divided by $N_H \times N_v$ (for example, 2×1) is $F_{01}=N_H \times F$ (or $F_{02}=N_H \times F$) and becomes dark. The effective depth of field of each of the first corrected viewpoint images (or the second corrected viewpoint images) is $\pm N_H \times F \times \delta$, which is as deep as $N_H$ times, and the focusing range is widened to $N_H$ times. That is, a subject image focused on each first corrected viewpoint image (or the second corrected viewpoint image) is acquired within a range of the effective depth of field "$\pm N_H \times F \times \delta$". Therefore, the refocusing processing unit 156 can readjust (refocus) the focus position after imaging through the refocusing process of translating the first corrected viewpoint image (the second corrected viewpoint image) along the main ray angle θa (or θb) illustrated in FIG. 12 and performing addition.

The amount of defocus d from the imaging surface with which the focus position after imaging can be readjusted (refocused) is limited. The refocusable range of the amount of defocus d is substantially in a range of Equation (10).

$$|d| \leq N_H F \delta \quad (10)$$

The allowable confusion circled is defined by, for example, δ=2·ΔX (a reciprocal of the Nyquist frequency 1/(2ΔX) of a pixel period ΔX). Thus, by calculating the refocusable range, it is possible to correspond to an operable range when the focus position is changed (refocused) by a user operation. Further, since it is possible to previously recognize rays (subject) that can be focused through the refocusing process, it is possible to perform imaging again by controlling imaging conditions such as a state of the optical image forming system so that a predetermined subject is included in the refocusable range.

Figure 15A:
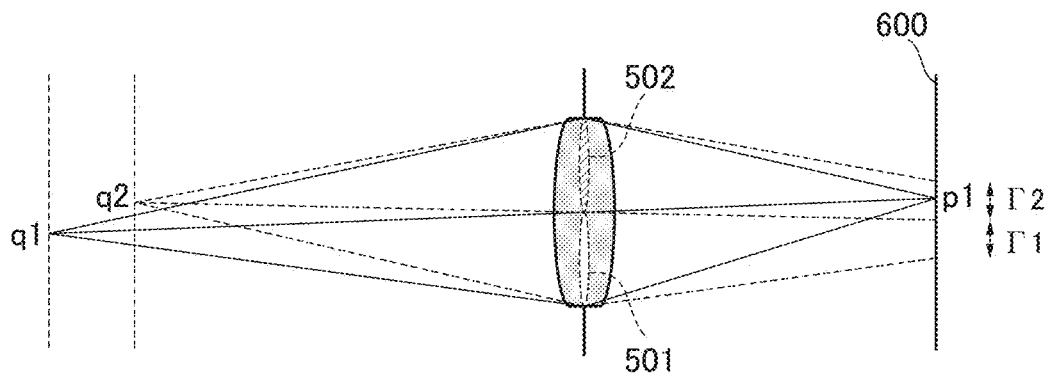
FIGS. 15A to 15C are diagrams illustrating a principle of a viewpoint movement process.
Figure 15B:
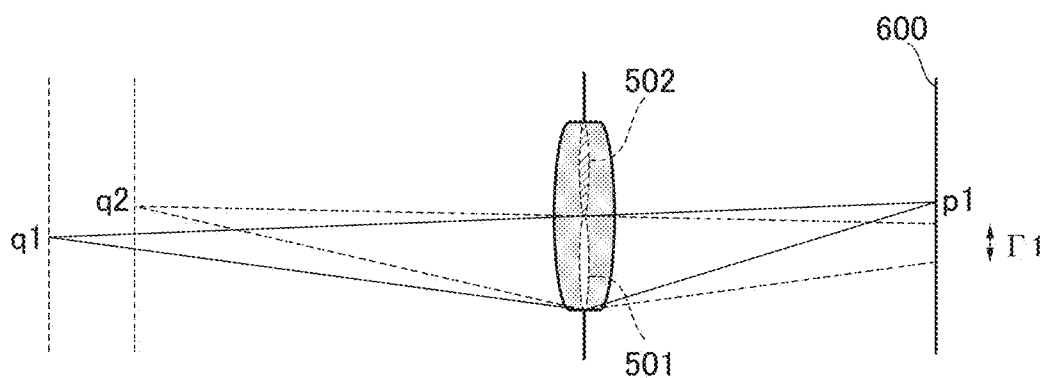
Figure 15C:
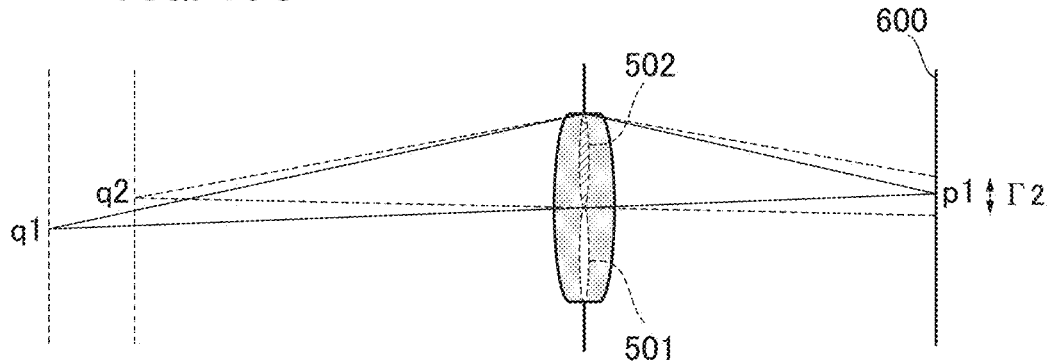

Next, the viewpoint movement process will be described. The viewpoint movement process is a process that is executed by the viewpoint change processing unit 155 in order to reduce blur caused by a non-main subject when blur of the non-main subject in front covers the main subject. FIGS. 15A to 15C are diagrams illustrating an outline of the viewpoint movement process. In FIGS. 15A to 15C, the imaging element 107 is arranged on the imaging surface 600, and the exit pupil of the optical image forming system is divided into two, that is, the first pupil partial area 501 and the second pupil partial area 502, as in FIG. 12. An image that has passed through the first pupil partial area 501 becomes a first viewpoint image and an image that has passed through the second pupil partial area 502 becomes a second viewpoint image. The viewpoint movement is performed using a plurality of viewpoint images acquired by an imaging element including a plurality of photoelectric conversion portions. In the embodiment, a viewpoint is moved using the first viewpoint image and the second viewpoint image and a combined image is generated.

FIG. 15A illustrates an example in which a blurred image Γ1+Γ2 of the subject q2 in front is overlapped with an in-focus image p1 of the main subject q1, imaging is performed, and perspective conflict (front blur covering on the main subject) occurs in the captured image. The example illustrated in FIG. 15A is divided into a light beam passing through the first pupil partial area 501 of the optical image forming system and a light beam passing through the second pupil partial area 502, as illustrated in FIGS. 10B and 10C.

In FIG. 15B, the light beam from the main subject q1 passes through the first pupil partial area 501 and forms an image on the image p1 in the in-focus state. On the other hand, the light beam from the subject q2 in front passes through the first pupil partial area 501 and spreads to the blurred image Γ1 in the defocused state. Each light beam is received by the first subpixel 201 of each pixel of the imaging element 107, and the first viewpoint image is generated. As illustrated in FIG. 15B, in the first viewpoint image, the image p1 of the main subject q1 and the blurred image Γ1 of the subject q2 in front are received without overlapping.

In FIG. 15C, the light beam from the main subject q1 passes through the second pupil partial area 502 and forms an image on the image p1 in the in-focus state. On the other hand, the light beam from the subject q2 in front passes through the second pupil partial area 502 and spreads to the blurred image Γ2 in the defocused state. Each light beam is received by the second subpixel 202 of each pixel of the imaging element 107, and the second viewpoint image is generated. As illustrated in FIG. 15C, in the second viewpoint image, the image p1 of the main subject q1 and the blurred image Γ2 of the subject q2 in front are overlapped and received.

In FIGS. 15B and 15C, an area near the image p1 of the main subject q1 is set as a predetermined area. In FIG. 15B, a range of the blurred image Γ1 of the subject q2 on the nearest side in the predetermined area is narrow, and there also is little reflection. Therefore, the contrast evaluation value in the predetermined area is increased. On the other hand, in FIG. 15C, the range of the blurred image Γ1 of the subject q2 on the nearest side in the predetermined area is wide, and there are many reflections. Therefore, the contrast evaluation value in the predetermined area increases. Therefore, the contrast evaluation value in the predetermined area decreases. Therefore, in the predetermined area, the weight of the first viewpoint image having less overlap between the image p1 and the blurred image Γ1 is increased, the weight of the second viewpoint image has large overlap between the image p1 and the blurred image Γ2 is decreased, and these are added. Accordingly, it is possible to reduce front blur covering for the main subject.

Next, a process in which the viewpoint change processing unit 155 overlaps the first viewpoint image with the second viewpoint image using the weight will be described. The viewpoint change processing unit 155 inputs the first viewpoint image A(j, i) and the second viewpoint image B(j, i) described above.

First, the viewpoint change processing unit 155 sets a predetermined area R=[j1, j2]×[i1, i2] in which viewpoint movement is performed and a boundary width σ of the predetermined area. The viewpoint change processing unit 155 calculates a table function T(j, i) according to the predetermined area R and the boundary width σ of the predetermined area according to Equation (11).

$$T(j, i) = 0.5 * \left[ \tanh\frac{(j - j_1)}{\sigma} - \tanh\frac{(j - j_2)}{\sigma} \right] \times \\ 0.5 * \left[ \tanh\frac{(i - i_1)}{\sigma} - \tanh\frac{(i - i_2)}{\sigma} \right] \quad (11)$$

The value of the table function T(j, i) is 1 inside the predetermined area R, 0 outside the predetermined area R, and continuously changes from about 1 to 0 at the boundary width σ of the predetermined area R. It should be noted that the viewpoint change processing unit 155 may have the predetermined area in a circular shape or another arbitrary shape, as necessary. Further, a plurality of predetermined areas and a plurality of boundary widths may be set.

Then, the viewpoint change processing unit 155 calculates a weighting factor. As a real coefficient w (−1≤w≤1), the first weighting factor Wa(j, i) of the first viewpoint image A(j, i) is calculated using Equation (12A), The second weighting factor Wb(j, i) of the second viewpoint image B(j, i) is calculated using Equation (12B).

$$W_a(j,i)=1-wT(j,i), \quad (12A)$$

$$W_b(j,i)=1+wT(j,i), \quad (12B)$$

In the predetermined area, when the addition rate of the first viewpoint image A(j, i) is increased and the depth of field is corrected, setting is performed within the range of −1≤w<0. On the other hand, when the addition rate of the second viewpoint image B(j, i) is increased and the depth of field is corrected, setting is performed within the range of 0<w≤1. w=0 may be set, W1≡W2≡1 may be set, and the depth of field may not be corrected.

Next, the viewpoint change processing unit 155 generates an output image I(j, i). The viewpoint change processing unit 155 adds the first viewpoint image A(j, i) weighted with the first weighting factor Wa(j, i) and the second viewpoint image B(j, i) weighted with the second weighting factor Wb(j, i) according to Equation (13) to generate the output image I(j, i).

$$I(j,i)=W_a(j,i)*A(j,i)+W_b(j,i)*B(j,i). \quad (13)$$

Further, the viewpoint change processing unit 155 may generate the output image $I_s$(j, i) according to Equation (14A) or Equation (14B) in combination with the refocusing process using the amount of shift s.

$$I_s(j,i)=W_a(j,i)*A(j,i)+W_b(j,i)*B(j,i+s), \quad (14A)$$

$$I_s(j,i)=W_a(j,i)*A(j,i)+W_b(j,i+s)*B(j,i+s) \quad (14B)$$

The generated output image $i_s$ (j, i) is an image in which the viewpoint has been moved and an image in which the focus position is re-adjusted (refocused).

Thus, a weighting factor that continuously changes according to the area of the output image is used, and the plurality of respective viewpoint images are weighted with the weighting factor and combined to generate an output image. It is possible to generate an image in which the front blur covering for the main subject q1 has been reduced by making the first weighting factor $W_a$ of the first viewpoint image having a less overlap of the image p1 and the blurred image Γ1 greater than the second weighting factor $W_b$ in the predetermined area and generating the output image. That is, in order to reduce front blur covering, the viewpoint change processing unit 155 may decrease the weighting factor of the viewpoint image in which the subject on the nearest side is imaged in the widest range in the predetermined area, or increase the weighting factor of the viewpoint image in which the subject on the nearest side is imaged in the narrowest range. Similarly, in order to reduce front blur covering, the viewpoint change processing unit 155 may decrease the weighting factor of the viewpoint image having the smallest contrast evaluation value in the predetermined area, or increase the weighting factor of the viewpoint image having the greatest contrast evaluation value.

It should be noted that, since the viewpoint change processing unit 155 does not changes a blur shape of the optical image forming system in an area other than the predetermined area in which the viewpoint movement process is not performed, the viewpoint change processing unit 155 may substantially evenly add the weighting factors (the first weighting factor and the second weighting factor) for the plurality of respective viewpoint images to generate the output image. Further, although a method of generating an output image in which a weighting factor (that is, the addition rate) has been changed according to designation of the user will be described below, the user may designate a predetermined area in which the viewpoint movement process is performed.

Next, the pupil shift at the peripheral image height of the imaging element 107 will be described. FIGS. 16A to 16C are schematic illustrative diagrams of the pupil shift at the peripheral image height of the imaging element. FIGS. 16A to 16C specifically show a relationship between the first pupil partial area 501 received by the first subpixel 201 of each pixel arranged in the imaging element, the second pupil partial area 502 received by the second subpixel 202, and the exit pupil 400 of the optical image forming system.

FIG. 16A illustrates a case in which an exit pupil distance Dl of the optical image forming system and a set pupil distance Ds of the imaging element 107 are the same. In this case, the exit pupil 400 of the optical image forming system is substantially uniformly divided into pupils by the first pupil partial area 501 and the second pupil partial area 502 both in the case of a center image height and a peripheral image height.

On the other hand, FIG. 16B illustrates a case in which the exit pupil distance Dl of the optical image forming system is shorter than the set pupil distance Ds of the imaging element 107. In this case, at the peripheral image height, the exit pupil 400 of the optical image forming system is ununiformly divided into pupils by the first pupil partial area 501 and the second pupil partial area 502. In the example of FIG. 16B, the effective aperture value of the first viewpoint image corresponding to the first pupil partial area 501 is smaller (brighter) than the effective aperture value of the second viewpoint image corresponding to the second pupil partial area 502. On the other hand, at an opposite image height (not illustrated), the effective aperture value of the first viewpoint image corresponding to the first pupil partial area 501 is greater (darker) than the effective aperture value of the second viewpoint image corresponding to the second pupil partial area 502.

FIG. 16C illustrates a case in which the exit pupil distance Dl of the optical image forming system is longer than the set pupil distance Ds of the imaging element 107. In this case, at the peripheral image height, the exit pupil 400 of the optical image forming system is ununiformly divided into pupils by the first pupil partial area 501 and the second pupil partial area 502. In the example of FIG. 16C, the effective aperture value of the first viewpoint image corresponding to the first pupil partial area 501 is greater (darker) than the effective aperture value of the second viewpoint image corresponding to the second pupil partial area 502. On the other hand, at an opposite image height (not illustrated), the effective aperture value of the first viewpoint image corresponding to the first pupil partial area 501 is smaller (brighter) than the effective aperture value of the second viewpoint image corresponding to the second pupil partial area 502.

That is, as the pupil division becomes ununiform at the peripheral image height due to the pupil shift, the effective F values of the first viewpoint image and the second viewpoint image also become nonuniform. Therefore, the spreading of blur of either the first viewpoint image or the second viewpoint image becomes larger, and the spreading of the other blur is smaller. Therefore, it is desirable for the viewpoint change processing unit 155 to minimize the weighting factor of the viewpoint image having the smallest effective aperture value in the predetermined area of the output image or to maximize the weighting factor of the viewpoint image having the greatest effective aperture value, as necessary. By performing such a viewpoint movement process, it is possible to reduce the front blur covering on the main subject.

Next, a depth extension process in the viewpoint change processing unit 155 will be described. As described with reference to FIGS. 15A to 15C and FIGS. 16A to 16C, the image that has passed through the first pupil partial area 501 becomes the first viewpoint image, and the image that has passed through the second pupil partial area 502 becomes the second viewpoint image. Since each viewpoint image is an image obtained by passing through half of the original pupil area, an aperture diameter in the horizontal direction is halved in the case of a pupil division area divided in two in the horizontal direction. Therefore, the depth of field in the horizontal direction is quadrupled. Since the embodiment is not a configuration in which the pupil is divided in the vertical direction, there is no change in the depth of field in the vertical direction. Therefore, the first viewpoint image or the second viewpoint image become images having, as a vertical and horizontal average, a depth of field which is twice the depth of field of the image (A+B image) obtained by combining the first viewpoint image and the second viewpoint image.

The viewpoint change processing unit 155 can generate an image with an enlarged depth of field by changing an addition rate of the first viewpoint image or the second viewpoint image to a value other than 1:1 to generate a combined image. Further, the viewpoint change processing unit 155 can generate a combined image in which the depth of field is enlarged and the outline is enhanced by applying the unsharp mask process using the contrast distribution and the image shift distribution to the image in which the addition rate of the first viewpoint image or the second viewpoint image has been changed. Further, in the depth enlarging process, a predetermined area may be processed according to a designation of the user, similar to the viewpoint movement process. It should be noted that the development process described above is applied to the combined image output from the viewpoint change processing unit 155, and the image to which the development process has been applied is output from the image processing circuit 125.

Further, a process of reducing the front blur covering in which the main subject is hidden due to great blur of a foreground located in front of the main subject (blur adjustment process) can be performed through the viewpoint change processing using the first viewpoint image and the second viewpoint image. Further, a process of separating an unnecessary component such as a ghost in which a part of light incident on the optical imaging system appears in the captured image and the parallax component from each other and reducing the unnecessary component such as the ghost (an unnecessary component reduction process) can be performed through viewpoint change processing using the first viewpoint image and the second viewpoint image.

Figure 17:
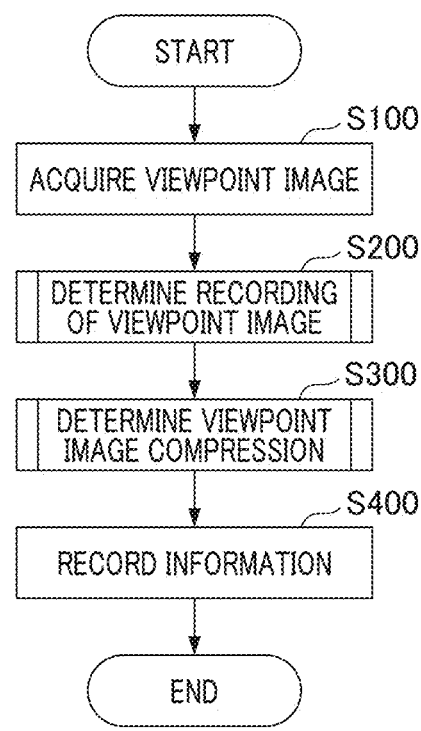
FIG. 17 is a flowchart showing a process of recording information.
Figure 18:
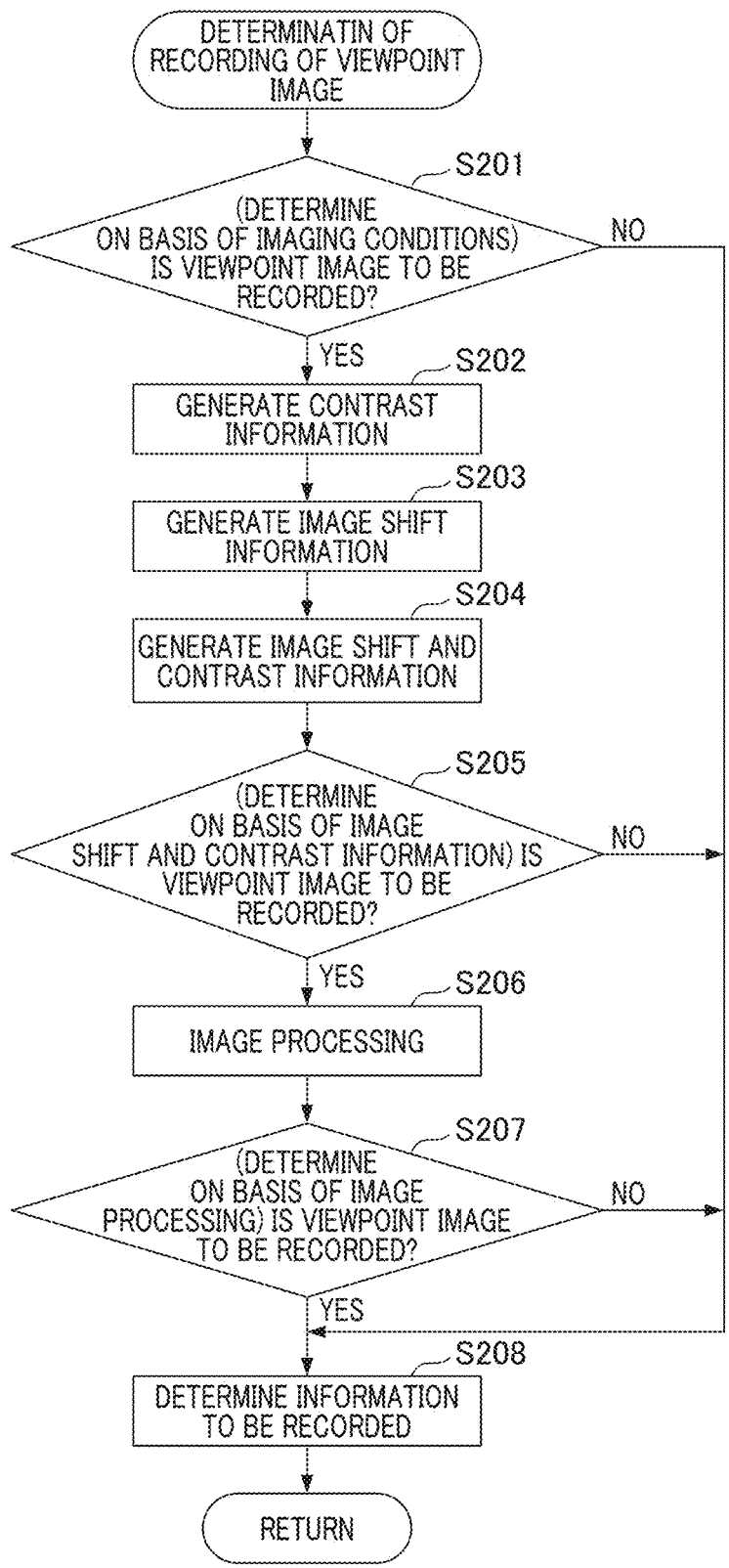
FIG. 18 is a flowchart showing a process of determining information to be recorded.
Figure 19:
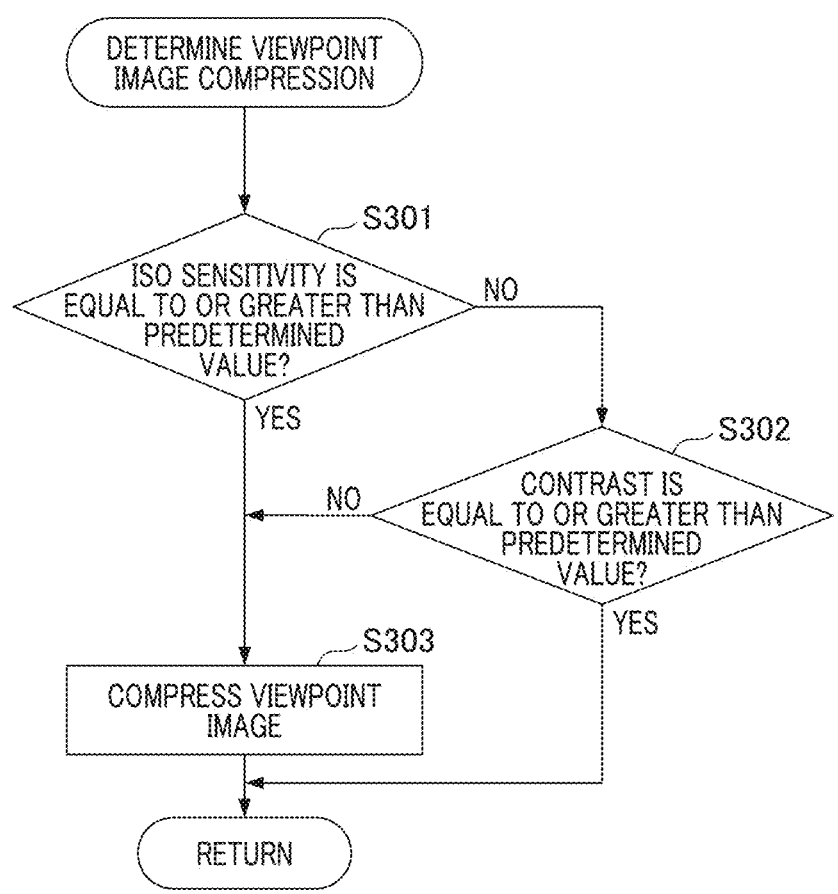
FIG. 19 is a flowchart showing a process of compressing a viewpoint image.

Next, a method of selecting and storing information necessary for image processing such as the refocusing process, the viewpoint movement process, the blurring adjustment, and the unnecessary component reduction process according to imaging conditions, the contrast information, the processing information will be described with reference to FIGS. 17 to 19. FIG. 17 is a flowchart showing a process of recording information. FIG. 18 is a flowchart showing a process of determining information to be recorded. FIG. 19 is a flowchart showing a process of compressing a viewpoint image. It should be noted that FIGS. 17 to 19 are executed by the image processing circuit 125 and the CPU 121.

In step S100, the imaging element driving circuit 124 controls the imaging element 107 according to the set imaging conditions to acquire a viewpoint image. The imaging conditions include an aperture value, a shutter speed, ISO sensitivity, focal length, and a subject distance. The value may be set on the basis of values calculated by automatically setting exposure according to the imaging condition and brightness of a subject or the user may manually set values.

In step S200, it is determined whether or not the viewpoint image is to be recorded on the flash memory 133 from the imaging conditions set in step S100. Here, a method of determining whether to record the viewpoint image in the flash memory 133 will be described with reference to FIG. 18.

In step S201, it is determined whether or not the viewpoint image is to be recorded on the flash memory 133 on the basis of the imaging conditions. When an effect to be obtained through image processing using the viewpoint image is great, the viewpoint image is recorded, and when the effect is small, the viewpoint image is not recorded. Whether or not the effect of image processing is great is determined on the basis of imaging conditions. The imaging conditions here are, for example, an aperture value, an ISO sensitivity, a focal length, and the like.

First, a method of determination using the aperture value will be described. As the aperture value is greater, the depth of field becomes greater and a parallax between the first viewpoint image and the second viewpoint image becomes smaller. When the parallax between the first viewpoint image and the second viewpoint image is small, the effect of image processing (in particular, a blur adjustment process or an unnecessary component reduction process) is reduced. Therefore, when the aperture value is equal to or greater than a predetermined value, it is determined that the viewpoint image is not to be recorded. On the other hand, when the aperture value is smaller than the predetermined value, it is determined that the viewpoint image is to be recorded.

Next, a method of a determination using ISO sensitivity will be described. As the ISO sensitivity increases, the S/N decreases (that is, deteriorates), and changes before and after the image processing become difficult to be visually recognized. Small changes before and after image processing means a small effect of image processing. Therefore, when the ISO sensitivity is equal to or higher than a predetermined value, it is determined that the viewpoint image is not to be recorded. On the other hand, when the ISO sensitivity is smaller than the predetermined value, it is determined that the viewpoint image is to be recorded.

Finally, a method of a determination using a focal length will be described. An actual distance conversion value of the amount of defocus in the refocusing process is proportional to a longitudinal magnification (a square of a lateral magnification), and in a close subject, since the actual distance conversion value of the amount of defocus change through the refocusing process is small, it is difficult for the effect to be visually recognized. Further, in a long distance (for example, infinity), since the actual distance conversion value of the amount of defocus change through the refocusing process is great, the effect of appropriate image processing (in particular, the refocusing process) according to a subject size cannot be applied. Therefore, when the focal length is out of a predetermined focal length range, it is determined that the viewpoint image is not to be recorded. On the other hand, when the focal length is within the predetermined focal length range, it is determined that the viewpoint image is to be recorded. It should be noted that a range of the predetermined focal length in which the effect of the amount of defocus change through the refocusing process can be sufficiently obtained is set for each focal length of the lens.

When it is determined in step S201 that the viewpoint image is to be recorded, the process proceeds to step S201. On the other hand, when it is determined that the viewpoint image is not to be recorded, the process proceeds to step S206. It should be noted that, in step S201, the aperture value, the ISO sensitivity, and the focal length are described as the imaging conditions, but the present invention is not limited thereto. For example, when the shading processing unit 153 cannot correct the amount of light change due to an image height of the first viewpoint image and the second viewpoint image, it can be determined whether the viewpoint image is to be recorded on the flash memory 133. Further, it may be determined whether or not the viewpoint image is to be recorded on the flash memory 133 on the basis of a camera shake or panning action of a photographer, a focus state of the lens, or the like.

In step S202, contrast information of the captured image which is parallax related information is generated. The contrast information is information corresponding to the contrast distribution. The contrast information is generated by combining the first viewpoint image with the second viewpoint image. After the contrast information is generated, the process proceeds to step S203.

In step S203, the image shift information which is parallax related information is generated. The image shift information is information corresponding to the distribution of the amount of image shift. The image shift information is generated from the viewpoint image. After the image shift information is generated, the process proceeds to step S204.

In step S204, image shift and contrast information which is parallax related information is generated. The image shift and contrast information is information obtained by integrating the contrast information generated in step S202 and the image shift information generated in step S203. After image shift and contrast information is generated, the process proceeds to step S205.

In step S205, it is determined whether or not the viewpoint image is to be recorded on the flash memory 133 on the basis of the image shift and contrast information generated in step S204. Whether or not the viewpoint image is to be recorded is determined according to whether or not an area having a predetermined contrast or more in the image shift and contrast information is equal to or greater than a predetermined value (a size of a predetermined area). When the area having a predetermined contrast or more exists in the image shift and contrast information, the effect of image processing is large, and therefore, it is determined that the viewpoint image is to be recorded. On the other hand, when the area having the predetermined contrast or more is smaller than the predetermined value, the effect of the image processing is small, and therefore, it is determined that the viewpoint image is not to be recorded.

When the area having the predetermined contrast or more in the image shift and contrast information is equal to or greater than the predetermined value, that is, when the viewpoint image is to be recorded, the contrast information or the image shift and contrast information may be further recorded on the flash memory 133. When it is determined in step S205 that the viewpoint image is to be recorded, the process proceeds to step S206. On the other hand, when it is determined that the viewpoint image is not to be recorded, the process proceeds to step S208.

In step S206, image processing is performed on the viewpoint image to generate a combined image. After the generation, the process proceeds to step S207. The image processing is, for example, refocusing processing, a viewpoint movement process, blurring adjustment, or a unnecessary component reduction process.

In step S207, it is determined whether or not the viewpoint image is to be recorded on the basis of the image processing. When predetermined image processing using viewpoint images, such as one or more of a refocusing process, a viewpoint movement process, blurring adjustment, an unnecessary component reduction process has been performed in the image processing of the viewpoint image performed in step S206, it is determined that the viewpoint image is not recorded. Further, even when the above-described image processing is not performed, and when predetermined image processing using the viewpoint image is not performed in the image processing after step S207, it may be determined that the viewpoint image is not to be recorded.

On the other hand, even when the predetermined image processing using the viewpoint image is performed in the image processing of step S206, and when the predetermined image processing using the viewpoint image is performed in the image processing after step S207, it may be determined that the viewpoint image is to be recorded. Further, when the refocusing process using the viewpoint image is performed in the image processing after step S207, the viewpoint image may not be recorded and the captured image and the image shift and contrast information may be stored. It should be noted that, in step S207, it may be determined whether or not the viewpoint image is to be recorded according to a user instruction. After it is determined whether or not the viewpoint image is to be recorded, the process proceeds to step S208.

In step S208, information to be recorded on the flash memory 133 is determined. The information to be recorded on the flash memory 133 is determined on the basis of the determination in steps S201, S205, and S207. When it is determined that the viewpoint image is to be recorded in each step, for example, the first viewpoint image or the second viewpoint image, a captured image obtained by combining the first viewpoint image with the second viewpoint image, and the image shift and contrast information generated in step S204 are recorded. On the other hand, when it is determined that the viewpoint image is not to be recorded, only the captured image obtained by combining the first viewpoint image with the second viewpoint image is recorded. After information to be recorded on the flash memory 133 is determined, this subroutine ends, and the process proceeds to step S300 of the main routine.

It should be noted that the image shift and contrast information generated in step S204 may be recorded regardless of a determination as to whether or not the viewpoint image is to be recorded. By recording the image shift and contrast information, for example, even when it is determined that the viewpoint images are not to be recorded in step S201, step S205, and step S207, the image processing using the captured image and the image shift and contrast information can be performed.

Referring back to description of FIG. 17. In step S300, when it is determined in step S200 that the viewpoint image is to be recorded, it is determined whether or not the viewpoint image to be recorded on the flash memory 133 is to be compressed. Here, the determination as to whether or not viewpoint image compression is to be performed and the compression process in step S300 will be described with reference to FIG. 19. It should be noted that, in step S300, the user may select whether or not the viewpoint image is to be compressed.

In step S301, it is determined whether or not the ISO sensitivity, which is the imaging condition at the time of viewpoint image capturing, is equal to or greater than a predetermined value. When the ISO sensitivity is equal to or greater than the predetermined value, the S/N decreases (deteriorates). Therefore, the viewpoint images are added horizontally vertically and compressed to increase the S/N. When the ISO sensitivity is equal to or greater than the predetermined value (for example, ISO6400), the process proceeds to S303. On the other hand, when the ISO sensitivity is not equal to or greater than the predetermined value, the process proceeds to S302.

In S302, it is determined whether the contrast is equal to or greater than a predetermined value using the contrast information generated in S202. When the contrast is not equal to or greater than the predetermined value, it can be determined that the viewpoint image is a viewpoint image in which there is no high-frequency subject, and thus, the viewpoint image may be compressed through horizontal and vertical addition. When the contrast is not equal to or greater than the predetermined value, the process proceeds to S303. On the other hand, when the contrast is equal to or greater than the predetermined value, the viewpoint image compression determination ends without compressing the viewpoint image, and the process returns to the main flow.

In step S303, the viewpoint image is added for each of RGB in the horizontal or vertical direction, and compression is performed by reducing the number of pixels. By compressing and recording the viewpoint image, it is possible to generate an image shift distribution in which the S/N and accuracy of the image shift have been improved when the image shift distribution is generated in post-processing. Further, data capacity can be reduced through compression of the viewpoint images. It should be noted that although the method of compressing the viewpoint image has been described as the horizontal and vertical addition in the embodiment, low pass filter processing or a demosaicing process may be used.

The number of horizontal or vertical additions when the viewpoint image is compressed, that is, the compression rate at the time of compression may be changed according to an imaging condition or a contrast value. For example, as ISO sensitivity is higher, the number of horizontal and vertical addition pixels is increased and compression is performed at a higher compression rate. Further, as the contrast value increases, the number of horizontal and vertical addition pixels is increased and the compression is performed at a high compression rate. Further, as the aperture value is greater, the number of horizontal and vertical addition pixels may be increased and the compression may be performed at a high compression rate.

As illustrated in FIG. 19, a determination condition is that the ISO sensitivity has a higher priority than the contrast value. When the ISO sensitivity is high, the S/N decreases even when the contrast value is high, and thus, the accuracy of the image shift decreases. Therefore, when the ISO sensitivity is high, horizontal or vertical addition of the viewpoint images may be performed regardless of the contrast value to improve S/N, and then, correlation calculation may be performed. After the compression process of step S303 is completed, the viewpoint image compression determination ends and the process returns to the main flow.

In step S400, recording information prepared in steps S200 and S300 is recorded on the flash memory 133. After recording, the main flow ends.

As described above, according to the embodiment, since data to be recorded is determined and compressed according to the imaging conditions or performance of image processing, it is possible to record the viewpoint image with an appropriate capacity. Therefore, a capacity of data to be recorded on the flash memory 133 can be suppressed.

Further, the example in which the viewpoint image is not recorded according to the imaging condition or the result of the image processing has been described in the above-described embodiment, but the present invention is not limited thereto, and the viewpoint image may, be compressed or the compression rate may be controlled instead of controlling the presence or absence of recording of the viewpoint image. That is, the CPU 121 performs control of presence or absence of compression or the compression rate instead of controlling the presence or absence of recording as a result of the determination of each condition in steps S201, S205, and S207. In this case, the branch at which a viewpoint image is not recorded (NO in each determination flow) corresponds to a branch at which the compression of the viewpoint image is not performed or a branch at Which the compression rate is set to be higher. The branch at which the viewpoint image is recorded (YES in each determination flow) corresponds to a branch at which the compression of the viewpoint image is not performed or a lower compression rate is set.

OTHER EMBODIMENTS

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-180174, filed Sep. 20 2017, Japanese Patent Application No. 2017-180177, filed Sep. 20 2017, Japanese Patent Application No. 2018-123774, filed Jun. 29 2018, which are hereby incorporated by reference wherein in their entirety.

What is claimed is:

1. An imaging apparatus comprising:
a memory; and
at least one processor configured to perform, in accordance with a program stored in the memory, functions of:
an acquisition unit configured to acquire a plurality of viewpoint images captured at a same time;
an imaging condition acquisition unit configured to acquire an imaging condition when the viewpoint image is captured, and
a compression unit configured to compress the viewpoint image to be recorded on the recording unit,
wherein the compression unit controls an image size of the viewpoint image according to at least one of ISO sensitivity and an aperture value included in the imaging condition.

2. The imaging apparatus according to claim 1, further comprising a calculating unit configured to calculate contrast information corresponding to a contrast distribution on the basis of the viewpoint image,
wherein the compression unit compresses the viewpoint image when the area with a predetermined contrast or more in the contrast information is smaller than a predetermined value.

3. The imaging apparatus according to claim 2,
wherein the compression unit changes a compression rate for compressing the viewpoint image according to a value of the contrast information.

4. The imaging apparatus according to claim 1,
wherein the compression unit compresses the viewpoint image so that the image size after compression is smaller when the ISO sensitivity is a first value in comparison to when the ISO sensitivity is a second value that is smaller than the first value.

5. The imaging apparatus according to claim 1,
wherein the compression unit compresses the viewpoint image so that the image size after compression is smaller when the aperture value is a first value in comparison to when the aperture value is a second value that is smaller than the first value.

6. The imaging apparatus according to claim 1,
wherein the plurality of viewpoint images are images based on signals acquired from an imaging element having a plurality of microlenses and a plurality of photoelectric conversion units correspond to the respective microlenses.

7. The imaging apparatus according to claim 1,
wherein the plurality of viewpoint images are images based on signals acquired from an imaging element having a plurality of photoelectric conversion units that receive a light beam passing through different pupil areas of an optical image forming system.

8. A control method of an imaging apparatus, comprising:
acquiring a plurality of viewpoint images captured at a same time;
acquiring an imaging condition when the viewpoint image is captured; and
compressing the viewpoint image to be recorded on a recording unit,
wherein the compressing includes controlling an image size of the viewpoint image according to at least one of ISO sensitivity and an aperture value included in the imaging condition.

* * * * *